(12) United States Patent
Kim

(10) Patent No.: US 8,513,071 B2
(45) Date of Patent: Aug. 20, 2013

(54) METHOD OF FABRICATING A TFT SUBSTRATE INCLUDING A DATA INSULATING LAYER WITH A CONTACT HOLE OVERLAPPING A CHANNEL REGION

(75) Inventor: Dong-Gyu Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 193 days.

(21) Appl. No.: 12/780,726

(22) Filed: May 14, 2010

(65) Prior Publication Data

US 2011/0127531 A1 Jun. 2, 2011

(30) Foreign Application Priority Data

Nov. 30, 2009 (KR) ........................ 10-2009-0117186

(51) Int. Cl.
*H01L 21/00* (2006.01)
(52) U.S. Cl.
USPC .................................. 438/159; 257/E21.414
(58) Field of Classification Search
USPC .................... 438/158, 30, 151, 159; 257/59, 257/72, 213, E51.005, E29.117, E21.414
See application file for complete search history.

(56) References Cited

U.S. PATENT DOCUMENTS

| | | | |
|---|---|---|---|
| 6,573,954 B1 | 6/2003 | Hirose et al. | |
| 2002/0037646 A1* | 3/2002 | Lyu | 438/689 |
| 2005/0269568 A1* | 12/2005 | Koo et al. | 257/59 |
| 2007/0152567 A1* | 7/2007 | Yao et al. | 313/504 |
| 2008/0001177 A1* | 1/2008 | Kim et al. | 257/213 |
| 2008/0014665 A1* | 1/2008 | Kim | 438/30 |
| 2008/0246029 A1* | 10/2008 | Kang et al. | 257/40 |
| 2009/0225251 A1* | 9/2009 | Kaitoh et al. | 349/46 |

FOREIGN PATENT DOCUMENTS

| KR | 1020020085197 A | 11/2002 |
|---|---|---|
| KR | 1020050060791 A | 6/2005 |
| KR | 1020080060889 A | 7/2008 |

* cited by examiner

*Primary Examiner* — Bilkis Jahan
(74) *Attorney, Agent, or Firm* — Innovation Counsel LLP

(57) ABSTRACT

Provided are a display device, a thin-film transistor (TFT) substrate, and a method of fabricating the TFT substrate. The method includes: forming a gate electrode on a pixel region of a substrate; forming a gate insulating film on the gate electrode; forming a semiconductor layer on the gate insulating film to overlap the gate electrode; forming a source electrode and a drain electrode to overlap the semiconductor layer and thus form a channel region; and forming a data insulating film on the source electrode and the drain electrode and patterning the data insulating film such that part of a contact hole formed in the data insulating film overlaps the channel region.

9 Claims, 20 Drawing Sheets

METHOD OF FABRICATING A TFT SUBSTRATE INCLUDING A DATA INSULATING LAYER WITH A CONTACT HOLE OVERLAPPING A CHANNEL REGION

This application claims priority from Korean Patent Application No. 10-2009-0117186 filed on Nov. 30, 2009 in the Korean Intellectual Property Office, the disclosure of which application is incorporated herein by reference in its entirety.

BACKGROUND

1. Field of Disclosure

The present disclosure of invention relates to a display device, a thin-film transistor (TFT) structure, and a method of fabricating the TFT substrate, and more particularly, to a TFT based display device with maintained aperture ratio and minimized kickback voltage despite increased size of drain contact hole. The disclosure also relates to an Liquid Crystal Display (LCD) having a TFT array substrate that uses the here taught TFT structures, and a method of fabricating the LCD.

2. Description of Related Technology

Liquid crystal displays (LCDs) are one of the most widely used types of flat panel displays. Generally, an LCD includes two spaced apart substrates both having electrodes and a liquid crystal layer interposed between the substrates. In an LCD, voltages are applied to the electrodes to generate electric fields through the liquid crystal layer. The electric field determines an alignment of molecules in the liquid crystal layer, thereby controlling an amount of light that passes through light polarizing layers of the LCD.

Of the two substrates included in an LCD, one is typically referred to as the thin-film transistor (TFT) array substrate and it includes a plurality of pixel units organized in an array format and each having one or more thin-film transistors (TFTs) and one or more pixel electrodes. Traditionally, the other substrate (common electrode substrate) contains a color filters layer. However, recently, research into a Color on Array (COA) structure has intensified wherein the CoA structure provides color filters on the TFT substrate instead of on the common electrode substrate. Part of the research is directed to ways to improve the planarization, alignment, and optical characteristics of LCDs using the CoA structure. In particular, research is being conducted on ways to improve planarization characteristics of TFT substrates having the COA structure in order to increase the reliability of the TFT substrate. One research direction looks at ways to increase the thickness of a planarization film as a way to improve the planarization characteristics of a CoA structure.

However, when the thickness of the planarization film is increased, a width of a contact-providing through hole in the pixel unit structure generally needs to also increase. More specifically, it is a drain to pixel-electrode contact through hole that is provided in a light blocking or black-masked area of the pixel unit that generally needs to increase in size. As the hole size increases, however, a drain electrode beneath it also has to increase in size according to traditional design methodologies so as to assure proper registration with the widened hole. More specifically, when the contact hole in question is the one to the TFT drain and the area of the underlying drain electrode has to be increased to prevent the occurrence of an overlay miss between the drain electrode and the contact hole, several disadvantages flow from this result (from increased drain electrode area).

Firstly, the value of an undesirable parasitic capacitance between the drain and gate nodes of the TFT tends to increase. Secondly, the increased drain electrode size operates to reduce an aperture ratio (e.g., a ratio of the light passing portion versus light blocking portions of each of the repeated pixel units in the LCD. The reduction in the aperture ratio can deteriorate image quality and waste backlighting power. Also the increased size of the drain contact hole can lead to undesired leakage of light around the contact hole area.

SUMMARY

The present disclosure of invention provides methods of fabricating thin-film transistor (TFT) based pixel units having an increased or maintained aperture ratio and maintained or minimized parasitic capacitance between drain and gate nodes of the TFT so that excessive kick back voltage is suppressed.

The present teachings are not restricted to just the embodiments set forth herein as examples. Various aspects of the present teachings will become more apparent to one of ordinary skill in the art to which the present teachings most closely pertain by referencing the detailed description as given below.

According to an aspect of the present disclosure, there is provided a method of fabricating a TFT array substrate. The method includes: forming a gate electrode in a repeated pixel unit region of a substrate; forming a gate insulating film on the gate electrode; forming a semiconductor layer portion on the gate insulating film to overlap the gate electrode; forming a source electrode and a spaced apart drain electrode to overlap the semiconductor layer and to thus form a channel region; forming a channel passivating film that covers the exposed channel surface between the source and drain electrodes but does not cover the drain electrode, and forming a data insulating film on the source electrode and the drain electrode and patterning the data insulating film to form a through hole directed to contacting the drain electrode wherein part of the formed contact hole may overlap the passivated channel region and yet not create substantial deterioration of TFT performance.

According to another aspect of the present disclosure, there is provided a TFT array substrate including: a gate electrode formed on a pixel region of a substrate; a gate insulating film formed on the gate electrode; a semiconductor layer formed on the gate insulating film to overlap the gate electrode; a source electrode and a drain electrode overlapping the semiconductor layer; and a data insulating film formed on the source electrode and the drain electrode, wherein part of a contact hole formed in the data insulating film may overlap the channel region.

According to another aspect of the present disclosure, there is provided a liquid crystal display including: an insulating substrate; gate wiring formed on the insulating substrate and including a gate line and a gate electrode; a semiconductor pattern; data wiring including a data line, a source electrode, and a drain electrode which is separated from the source electrode; a passivation film formed on the data wiring and made of an organic material; and a contact hole formed through the passivation film and exposing a sidewall of the drain electrode so that connection to the pixel-electrode may include connection to the sidewall of the drain electrode. Other aspects will become clearer from the below detailed description.

BRIEF DESCRIPTION OF THE DRAWINGS

The above and other aspects and features of the present disclosure of invention will become more apparent by describing in detail exemplary embodiments thereof with reference to the attached drawings, in which.

DETAILED DESCRIPTION

Figure 1:
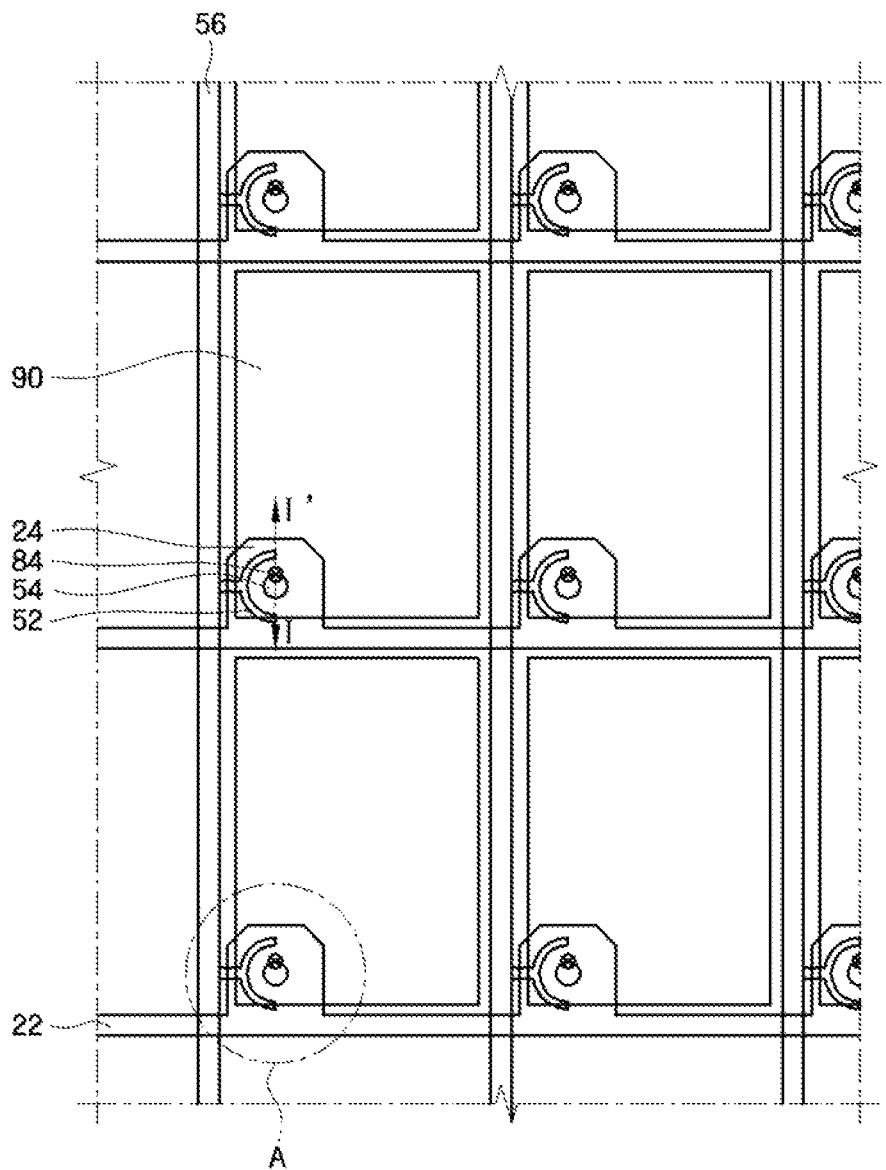
FIG. 1 is a plan view of a thin-film transistor (TFT) substrate according to a first exemplary embodiment of the present disclosure.

Advantages and features of devices formed in accordance with the present disclosure and methods of accomplishing the same may be understood more readily by reference to the following detailed description of exemplary embodiments and the accompanying drawings. The present teachings may, however, be embodied in many different forms and should not be construed as being limited to the exemplary embodiments set forth herein. Rather, these embodiments are provided so that this disclosure will be thorough and complete and will fully convey the concepts of the present teachings to those skilled in the relevant art. In some embodiments, well-known processing processes, well-known structures, and well-known technologies will not be specifically described in order to avoid ambiguous interpretations of the present teachings. Like reference numerals generally refer to like elements throughout the specification.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
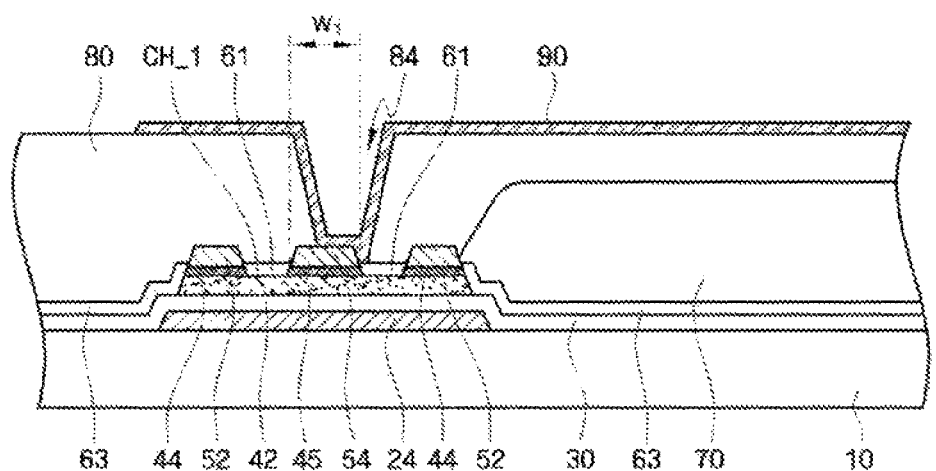
FIG. 2A is a cross-sectional view of the TFT substrate taken along the line I-I' of FIG. 1.
Figure 2B:
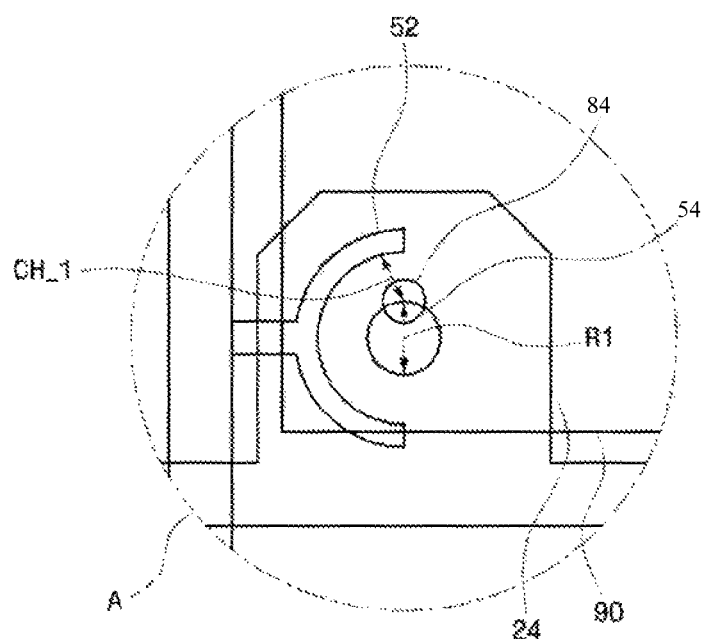
FIG. 2B is an enlarged view of a portion 'A' in FIG. 1.

Hereinafter, a TFT substrate according to a first exemplary embodiment will be described in detail with reference to FIGS. 1 through 2B. FIG. 1 is a plan view of the TFT substrate according to the first exemplary embodiment. FIG. 2A is a cross-sectional view of the TFT substrate taken along the line I-I' of FIG. 1. FIG. 2B is an enlarged view of a portion 'A' in FIG. 1.

Referring to FIGS. 1 through 2B, the TFT substrate includes various devices, such as thin-film transistors, which are formed on an insulating substrate 10. The insulating substrate 10 may be a light-passing one such as made of glass, including a soda lime glass or a boro silicate glass, or of a plastic.

Gate wiring, which delivers gate signals, is formed on the insulating substrate 10. The gate wiring includes a gate line 22 which extends in a first direction, for example, a horizontal direction, and a gate electrode 24 which integrally protrudes from the gate line 22 and is included in a thin-film transistor. In the first exemplary embodiment, the case where just one gate line 22 extends through each unit pixel region of a given row is described. However, two gate lines may also be formed in each unit pixel region to transmit gate signals to different subpixels. In this case, two gate electrodes may also be formed in each pixel region to be adjacent respectively to data lines on both sides of that pixel which contains plural subpixels (or plural pixel-electrodes).

In the first exemplary embodiment, each pixel region may be a bound region having its boundaries formed by adjacent gate lines 22 and adjacent data lines 56 intersecting therewith.

A charge storage line (not shown), which delivers a common voltage to a charge storage electrode, may also be formed on the insulating substrate 10 in a layer level the same as that of the gate wirings. The storage line may extend in the horizontal direction to be substantially parallel to the gate line 22.

The signal conveying wirings (e.g., the gate lines 22 and their integrally protruding gate electrodes 24, the storage lines, etc.) may be made of an aluminum (Al)-based metal, such as aluminum and/or an aluminum alloy, of a silver (Ag)-based metal, such as silver and a silver alloy, of a copper (Cu)-based metal such as copper and a copper alloy, of a molybdenum (Mo)-based metal such as molybdenum and a molybdenum alloy, of a chromium (Cr), or titanium (Ti) and/or tantalum (Ta) based metal.

In addition, the signal conveying wirings may have multi-film structures composed of two or more conductive films (not shown) with different physical characteristics. One of the two conductive films may be made of metal with relatively low resistivity, such as an aluminum-based metal, silver-based metal or copper-based metal, in order to reduce a signal delay or a voltage drop of the signal conveying wiring. The other one of the conductive films may be made of a different material, in particular, a material having superior contact characteristics (e.g., ohmic contact characteristics) with zinc oxide (ZnO), indium tin oxide (ITO) and indium zinc oxide (IZO), such as molybdenum-based metal, chromium, titanium, or tantalum. Examples of multi-film structures include a chromium lower film and an aluminum upper film or an aluminum lower film and a molybdenum upper film. However, the present teachings are not limited thereto. The signal wirings may be made of various other metals and conductors (e.g., including light-passing conductors).

A gate insulating film 30 is formed on the insulating substrate 10, the gate wiring, and the storage line. The gate insulating film 30 may be made of a silicon oxide (SiOx) and/or a silicon nitride (SiNx) or a silicon oxynitride (SiOxNy).

A semiconductor layer 42, which is formed of hydrogenated amorphous silicon or polycrystalline silicon, is disposed on the gate insulating film 30. The semiconductor layer 42 may have portions of various shapes. For example, the semiconductor layer portion 42 may be an island shape or may be formed as a linearly region. In the first exemplary embodiment, the semiconductor layer portion 40 is an island. The semiconductor layer portion 42 overlaps the area of the gate electrode 24.

Ohmic contact layer portions 44 and 45 formed of a contact enhancing material such as silicide or n+ hydrogenated amorphous silicon doped with n-type impurities in high concentration, may be disposed on the semiconductor layer 42. That is, a pair of the ohmic contact layer portions 44 and 45 may be formed on the semiconductor layer portion 42.

Signal carrying wirings may be formed on the ohmic contact layer portions 44 and 45 and the gate insulating film 30.

The signal carrying wirings include the data line 56, a source electrode 52 which branches off integrally from the data line 56, and a drain electrode 54 which is shaped like an island and is separated from the source electrode 52 by a predetermined gap (channel gap) to thereby face the source electrode 52.

The data line 56 generally extends in a vertical direction, crosses the gate line 22 and the storage line, and delivers a predetermined data voltage for selective application to the pixel-electrode of the pixel unit.

The source electrode 52 branches off integrally from the data line 56 toward the drain electrode 54. A data line contacting terminal end (not shown) is formed at an end of the data line 56 and receives a data signal from another layer or an external source to transmit the data signal to the data line 56.

The data wiring may be formed of refractory metal such as chromium, molybdenum-based metal, tantalum, and titanium. In addition, the data wiring may have a multi-film structure composed of a lower film (not shown), which is formed of refractory metal, and an upper film (not shown), which is formed of a material with low resistivity and is disposed on the lower film. Examples of multi-film structures include a chromium lower film and an aluminum upper film or an aluminum lower film and a molybdenum upper film. Alternatively, the multi-film structure may be a three-film structure having molybdenum-aluminum-molybdenum films.

The source electrode 52 overlaps at least part of the semiconductor layer 42. In addition, the drain electrode 54 faces the source electrode 52 and overlaps at least another part of the semiconductor layer 42.

Referring to the magnified view in FIG. 2B, a gate-controlled semiconductive first region of the semiconductor layer 42, which region is between the source electrode 52 and one side (left side in FIG. 2A) of the drain electrode 54, is defined as a first channel region CH_1. In the first channel region CH_1, a conductive channel through which electric charges can move, may be formed between the source electrode 52 and the drain electrode 54 when a turn-on gate voltage ($V_{gON}$) is applied to the gate electrode 24 and an appropriate data voltage is applied to the source electrode 52. The thus formed, conductive channel may allow electric current to flow from the source electrode 52 to the drain electrode 54 so as to thereby charge the pixel-electrode to a desired potential level.

In one embodiment, a width W1 or diameter R1 of the drain electrode 54 may be 6 μm or less. This width W1 may be partially overlapped by a bottom portion of a drain contact hole 84. If in this embodiment the width W1 (or diameter R1) of the drain electrode 54 is made greater than the 6 μm dimension, a corresponding aperture ratio of the pixel unit may be disadvantageously reduced. In this case, if the aperture ratio is reduced, the intensity of light emitted from light sources (not shown) in a backlight assembly (not shown) must be increased in order to secure a desired or standard luminance level out of the top side of the LCD. However, such an intensity increase may disadvantageously increase the overall power consumption of a liquid crystal display (LCD). Thus, the width W1 or diameter R1 of the drain electrode 54 should be 6 μm or less in this embodiment in order to prevent the undesired increase in the overall power consumption of the LCD.

The ohmic contact layer portions 44 and 45 are interposed between the semiconductor layer portion 42 thereunder and the source and drain electrodes 52 and 54 thereon to establish ohmic connections and reduce contact resistance between them.

A channel passivation layer 61 is formed in the region between the source electrode 52 and the drain electrode 54. The channel passivation layer 61 may be made of an inorganic matter such as SiNx and/or SiOx and/or SiOxNy. The channel passivation layer 61 protects exposed top surface portions of the semiconductor layer 42.

The channel passivation layer 61 is pre-patterned such that it does not cover top surfaces of the source electrode 52 and the drain electrode 54. Accordingly, at least the full top surface area of the drain electrode is available for contact therewith by way of a to-be formed, drain contact hole. (In one embodiment described below, sidewalls of the drain electrode are also available for contact therewith by way of a to-be formed, drain contact hole.) Because the channel passivation layer 61 is pre-patterned, when the drain electrode contacting through hole 84 is later formed through a data insulating film 80 (which will be described later) there is no need to first selectively etch through the passivation layer 61 to expose the drain electrode 54. Thus mass production fabrication is greatly simplified. A method for forming the pre-patterned channel passivation layer 61 will be detailed below (for example in reference to FIG. 8).

One of red, green, and blue color filters 70 is formed on each pixel region defined by the intersection of the gate line 22 and the data line 56. (Other color filters, e.g., white, cyan, etc. may also be used.)

Each of the color filters 70 passes light in its respectively predetermined and different wavelengths range. The color filters 70 may be arranged for example in a stripe, mosaic, or delta pattern.

The color filters 70 may be made of an organic material having photosensitivity, such as photoresist. The color filters 70 may be formed to a uniform thickness or formed in a stepped manner to have a predetermined step height. Each of the color filters 70 may be made of a red organic material which primarily passes light of a red wavelength, a blue organic material which primarily passes light of a blue wavelength, or a green organic material which primarily passes light of a green wavelength.

The data insulating film 80 (also planarization film 80 herein) is formed on the source electrode 52, the drain electrode 54, the passivation layer 61, and the color filters 70. The data insulating film 80 may be made of an organic photoresist material having superior planarization characteristics. Alternatively, the data insulating film 80 may be made of SiNx. The passivation layer 61 and the data insulating film 80 may be made of different materials. For example, when the passivation layer 61 is made of SiOx, the data insulating film 80 may be made of an organic material or SiNx. The data insulating film 80 may be formed to a thickness of approximately 3 μm to fully cover the color filters 70 so that the color filters 70 do not cause changes of distance between the overlying pixel-electrode 90 and a common electrode in the other substrate. Since the data insulating film 80 fully covers the color filters 70, it can have superior planarization characteristics.

The contact hole 84 is formed through the data insulating film 80 so as to extend to underlying portions of the drain electrode 54 and of the passivation layer 61. The pixel electrode 90, which will be described more fully later, and the drain electrode 54 are electrically connected to each other by the contact hole 84. Accordingly, a data signal can be transmitted to the pixel electrode 90 from the data line 56 by passing through the drain electrode 54 of the corresponding TFT. Here, part of the contact hole 84 may overlap the channel region (e.g., CH_2) but it is isolated from the overlapped portion of the channel region by the passivation layer 61.

As the thickness of the data insulating film 80 increases, a width of the contact hole 84 also tends to increase, thereby increasing the likelihood of an overlay miss between the drain electrode 54 and the bottom of the tapered contact hole 84. If the passivation layer 61 were not present, such an overlay miss may result in an internal short circuit, that is, may cause the pixel electrode 90 to directly connect to the semiconductor layer 42 such that a predetermined channel gap is made too short or shorted out completely and the TFT fails to operate as intended. To reduce the possibility of such internal short circuits, the area of the drain electrode 54 is typically increased in accordance with an increase in the width of the bottom of the contact hole 80. However, an increase in the area of the drain electrode 54 may result in an increase in a value of a parasitic capacitance Cgd between the drain (54) and the gate (24) nodes of the TFT, thereby increasing an undesirable kickback voltage of the TFT. (The kickback voltage tends to increase when the Cgd capacitance increases.) In addition, an increase in the area of the drain electrode 54 may result in a reduction in the aperture ratio. Consequently, image quality of a display device may deteriorate.

According to the present disclosure however, the passivation layer 61 is formed in the region between the source electrode 52 and the drain electrode 54 above the semiconductor layer 42. Thus, even when an overlay miss occurs; as is shown schematically in FIG. 2A, between the bottom of the contact hole 84 and the exposed upper surface of the drain electrode 54, the misalignment may not cause the internal short circuit conditions described above. That is, the passivation layer 61 is present to prevent the drain-contacting portion of the pixel electrode 90 from directly contacting the semiconductor layer 42 to thus shorten the effective length of the TFT channel. Note that although the plan view of FIG. 2B makes it appear as if the channel length is being shortened in region CH_1, this is not the case because the bottom of the drain contact hole is spaced apart from the channel surface by the thickness of the passivation layer 61. Therefore, according to the present disclosure, even when the width of the contact hole 84 increases in accordance with the increase in the thickness of the data insulating film 80, there is no need to correspondingly increase the area of the drain electrode 54 to accommodate for possible misalignment of the bottom of the contact hole. Accordingly, the value of the parasitic capacitance Cgd between the drain node (54) and the gate node (24) does not significantly increase. Consequently, an undesirable increase in the kickback voltage and an undesirable reduction in the aperture ratio can be substantially prevented.

After the drain contact hole 84 is formed, for example as a tapered hole, the pixel electrode 90 is formed on the data insulating film 80. The pixel electrode 90 may be formed of a transparent conductor, such as ITO or IZO, or of a reflective conductor such as aluminum depending on whether the LCD is a light through-passing kind or a light reflecting kind. The pixel electrode 90 is electrically connected to the drain electrode 54 by way of a portion of the deposited pixel-electrode material extending through the contact hole 84 to make at least partially overlapping contact with the upper surface of the drain electrode 54. The drain contacting portion of the pixel electrode 90 may be disposed on/above the drain electrode 54 and on the adjacent part of the passivation layer 61. That is, the passivation layer 61 is interposed between the pixel electrode 90 and the semiconductor layer 42. Accordingly, even when an overlay miss occurs between the bottom of the contact hole 84 and the drain electrode 54, this misalignment does not cause the above-described internal short circuit phenomenon to occur (e.g., effective shortening of the TFT channel length) due to the presence of the short-preventing passivation layer 61.

A column spacer (not shown) may be formed on the TFT substrate. The column spacer may be used to maintain a substantially constant cell gap between an upper substrate and the TFT substrate.

Hereinafter, a method of fabricating a TFT substrate according to a second exemplary embodiment will be described in detail with reference to FIGS. 3 through 12. FIGS. 3 through 11 are cross-sectional views sequentially showing processes included in the method of fabricating a TFT substrate according to the second exemplary embodiment. For simplicity, elements having the same functions as those shown in the drawings for the first exemplary embodiment are indicated by like reference numerals, and thus their description will be omitted or simplified.

Figure 3:
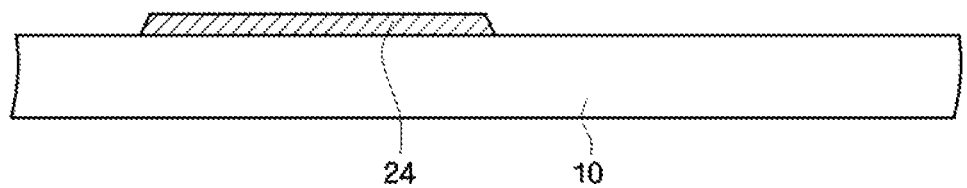
FIGS. 3 through 11 are cross-sectional views sequentially showing processes included in a method of fabricating a TFT substrate according to a second exemplary embodiment.

Referring to FIG. 3, a gate layer wiring pattern 22/24, which includes a patterned gate line 22 and a patterned gate electrode 24, and a patterned storage line (not shown) are formed on a light-passing insulating substrate 10.

The gate wiring layer may be formed by, e.g., blanket sputtering of the appropriate conductive materials. Then, the deposited gate wiring layer may be patterned by a wet-etching process or a dry-etching process. In the wet-etching process, an etchant, such as phosphoric acid, nitric acid or acetic acid, may be used in combination with an etchant resistant mask. In the dry-etching process, a fluorine-based etching gas, such as $Cl_2$ or $BCl_3$, may be used in combination with a plasma resistant mask whose pattern is defined with use of appropriate photolithography.

Figure 4:
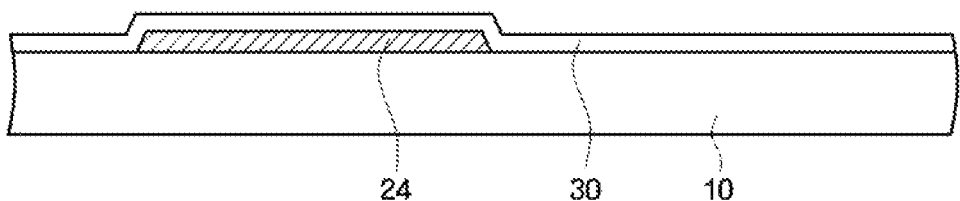

Referring to FIG. 4, next a gate insulating film 30 is formed on the insulating substrate 10, the patterned gate wiring layer 22/24. The gate insulating film 30 may be blanket formed by plasma enhanced chemical vapor deposition (PECVD) or reactive sputtering.

Figure 5:
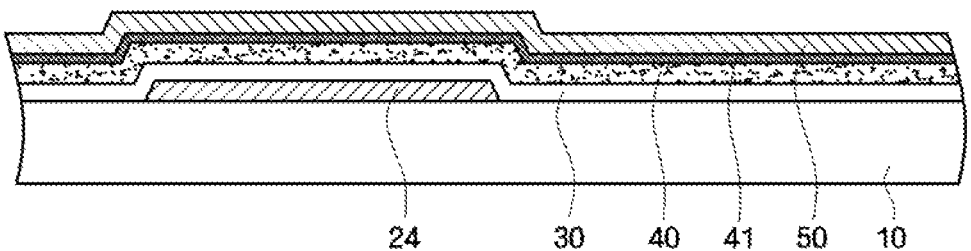
Figure 6:
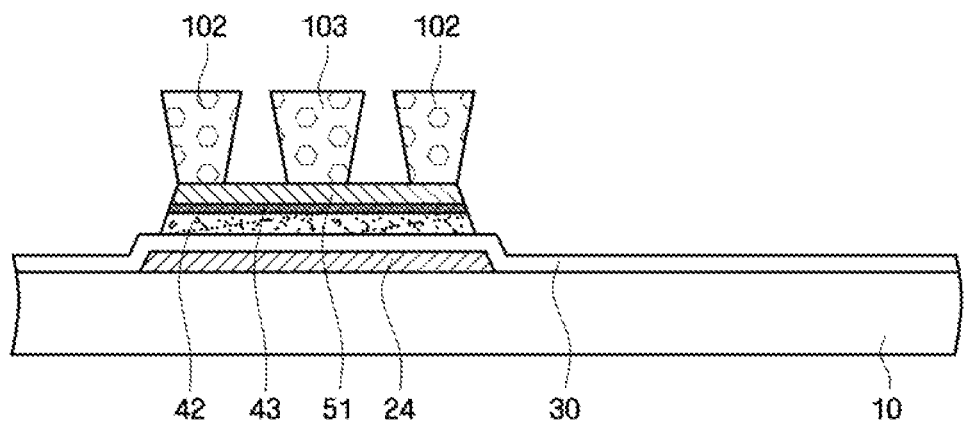

Referring to FIGS. 5 and 6, next a hydrogenated amorphous silicon layer 40, an n+ hydrogenated amorphous silicon layer 41 that is doped with n-type impurities in high concentration, and a conductive layer 50 are formed by stacking of respective conductive materials for forming the data wring layer are sequentially disposed on the gate insulating film 30. The hydrogenated amorphous silicon layer 40 and the n+ hydrogenated amorphous silicon layer 41 doped with n-type impurities in high concentration may be formed by PECVD or chemical vapor deposition (CVD). In addition, the conductive layer 50 may be formed by sputtering.

Next (between FIGS. 5 and 6), photoresist is coated on the conductive layer 50 and then developed to form photoresist patterns (not shown) for patterning in one step the hydrogenated amorphous silicon layer 40, the n+ hydrogenated amorphous silicon layer 41 doped with n-type impurities in high concentration, and the conductive layer 50. Then, the hydrogenated amorphous silicon layer 40, the n+ hydrogenated amorphous silicon layer 41 doped with n-type impurities in high concentration, and the conductive layer 50 are etched in one step using the photoresist patterns (not shown) as a mask, thereby forming a semiconductor layer 42, an ohmic contact layer pattern 43, and a conductive layer pattern 51, respectively as shown in FIG. 6.

Thereafter, new photoresist patterns 102 and 103 are formed on the conductive layer pattern 51 as shown in FIG. 6 for the purpose of next patterning the ohmic contact layer pattern 43 and the conductive layer pattern 51. The left and right side photoresist pattern portions 102 are used to pattern a corresponding portion of the conductive layer pattern 51 into a semi-circular shaped source electrode 52 (see FIG. 2B). On the other hand, the middle photoresist pattern 103 is used to pattern another portion of the conductive layer pattern 51 into the centrally located drain electrode 54. Although not shown in FIG. 6, the outer photoresist pattern portions 102 extend to also cover a leg portion of the Y-shaped source electrode 52 of FIG. 2B and portions 102 yet further extend to continuously surround the area where the color filter will be formed. The photoresist patterns 102 (and 103) are formed to a height sufficient to allow them to also serve as barrier ribs for containing color filter resin in an inkjet method that is used to later form the color filters 70 as will be described later. In addition, the photoresist patterns 102 and 103 may be inversely tapered (e.g., shaped as downward pointing frusto triangles in the cross section view) such that they can be easily exfoliated in a lift-off process which will be described later.

Figure 7:
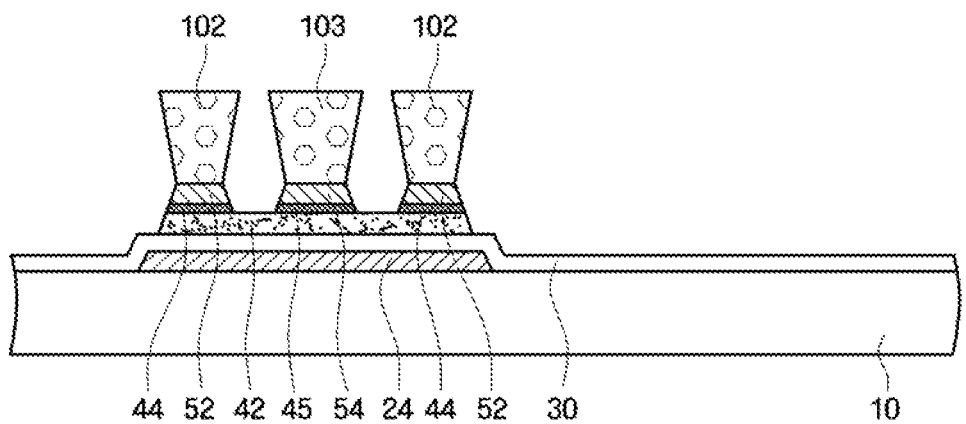

Referring next to FIG. 7, the conductive layer pattern 51 is patterned using the photoresist pattern 102 and 103 as an etch mask, thereby forming the source electrode 52 and the drain electrode 54. Here, the drain electrode 54 may be formed to a width (indicated by reference character 'W1' in FIG. 2A) or diameter (indicated by reference character 'R1' in FIG. 2B) of 6 μm or less.

The ohmic contact layer pattern 43 is also patterned at the same time as the conductive layer pattern 51. As a result, a patterned ohmic contact layer 44, which is overlapped by a bottom surface of the source electrode 52, and a patterned ohmic contact layer 45, which is overlapped by a bottom surface of the drain electrode 54, are formed. Since the source electrode 52 and the drain electrode 54 are formed above the semiconductor layer 42 and in spaced apart relation, a channel region CH_1 is formed in a region of the semiconductor layer 42 which is not overlapped by the source electrode 52 and the drain electrode 54.

Figure 8:
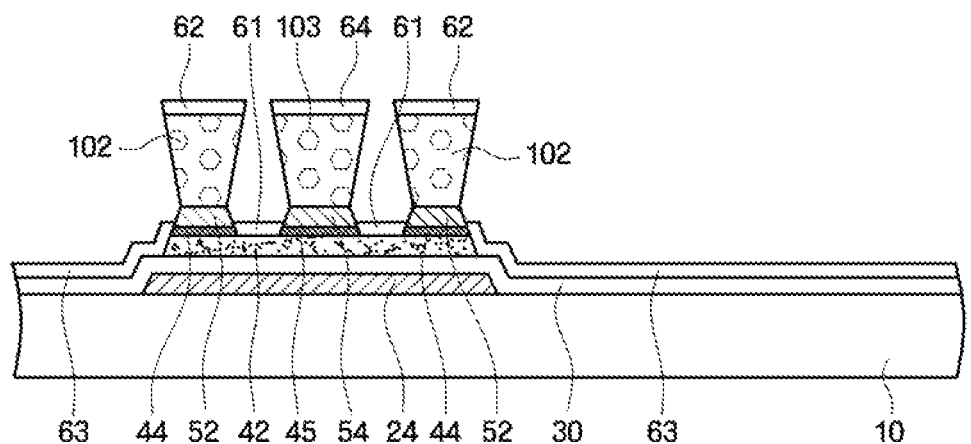

Referring to FIG. 8, while the photoresist patterns 102 and 103 are still in place, an insulating material is blanket deposited on all up facing and exposed surfaces of the resultant structure of FIG. 7 for example by PECVD or CVD deposition, thereby forming passivation layer regions 61 and 63 that do not overlap the source and drain electrodes, 52 and 54. The deposited insulating material may be SiO2 or SiNx. Due to the photoresist patterns 102 and 103 still being formed on the upward facing tops of the source electrode 52 and the drain electrode 54, the deposited insulating material that is stacked on upward facing top surfaces is not directly stacked on top surfaces of the source electrode 52 and the drain electrode 54 due to the photoresist patterns 102 and 103. Instead, the insulating material is stacked on the top surfaces of the photoresist patterns 102 and 103 as an insulating material layers 62 and 64. That is, the passivation layer regions 61 and 63 do not extend to directly cover the top surfaces of the source electrode 52 and the drain electrode 54. The full top surface area of the drain electrode 54 as well as optionally part of the sidewall surface area of the drain electrode 54 are left available for later contact with the pixel-electrode after the drain contact hole is formed (84 in FIG. 11).

When the photoresist patterns 102 and 103 are inversely tapered as shown in FIG. 8, the blanket deposited insulating material is not stacked on the down facing side walls of the photoresist patterns 102 and 103, and there is a break in continuity between passivation layer regions 61 and 63, thereby making it easy to later exfoliate the photoresist patterns 102 and 103 from the structure.

Figure 9:
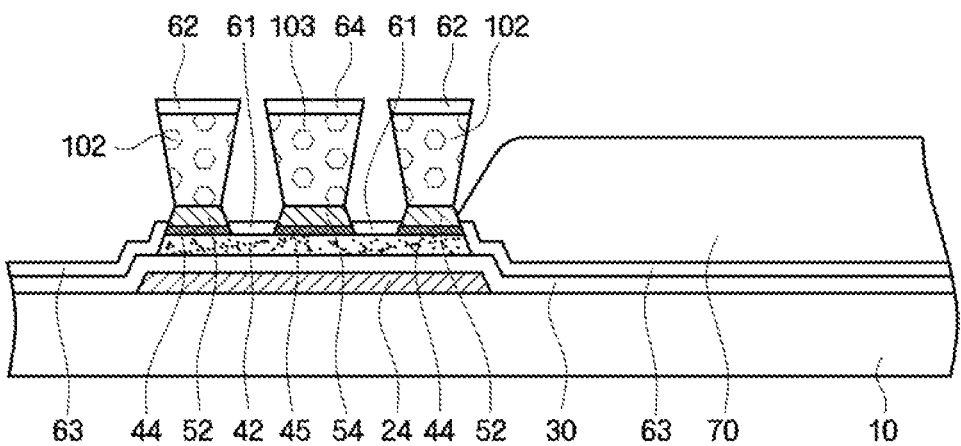

Referring to FIG. 9, next drops of a colored organic material are selectively deposited, for example by ink jet spraying over the resultant structure of FIG. 8 by using, e.g., an inkjet printing device (not shown). In this inkjet deposition method, the still present, photoresist patterns 102 and 103 are used as barrier ribs for containing the liquid colored organic material before it is hardened. In other words, each respective pixel region is surrounded by the photoresist patterns 102 and 103 when it is sprayed and it is filled with the colored organic material. There is no need to spray the colored organic material over the region between the source electrode 52 and the drain electrode 54 in which no image is displayed.

Specifically, to form the color filters 70 using an inkjet printing device, a red organic liquid material is sprayed over and thus fills a pixel region surrounded by the photoresist patterns 102 and 103 while the inkjet printing device is moved in a predetermined direction over the pixel region that is predetermined to be a red pixel unit. In the case of an RGB striped pattern being used, the red organic material is sprayed over one in every three pixel regions arranged in the direction in which the inkjet printing device is moved. Then, green and blue organic materials are also sprayed over the other pixel regions in the same way. If the inkjet printing device can spray all of the three colored organic materials, it may move over pixel regions while alternately spraying the three colored organic materials.

A colored organic material when it is sprayed is a hardenable liquid material. However, since the sprayed colored organic material has a sufficient amount of viscosity and it is surrounded by the photoresist pattern 102, it can stably remain within a pixel region. In the inkjet method, the photoresist patterns 102 and 103, which are formed to pattern the data wiring and the ohmic contact layers 44 and 45, can be used as ink jet barrier ribs. Thus, a process for separately forming barrier ribs can be omitted, which, in turn, simplifies the entire fabrication process.

The liquid, colored organic material plus solvent which is filled between the photoresist patterns 102 and 103 is dried and solidified for example by heat treatment or ultraviolet radiation. As a result, one of the red, green and blue filters 70 is formed in each pixel region.

Figure 10:
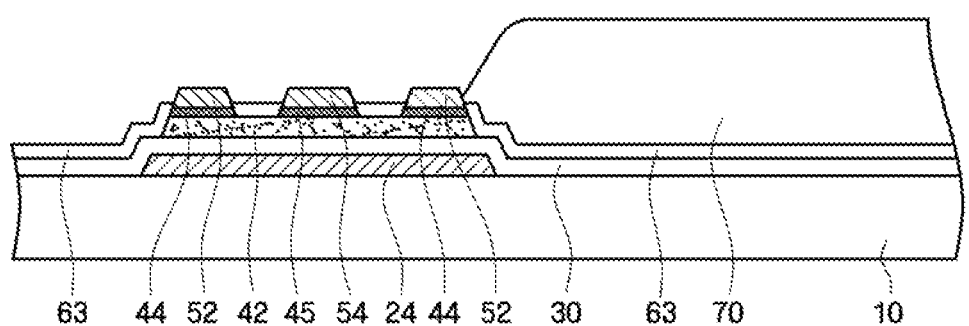

Referring to FIG. 10, the photoresist patterns 102 and 103 formed on the source electrode 52 and the drain electrode 54 are removed (exfoliated). Here, the insulating material layers 62 and 64 on the top surfaces of the photoresist patterns 102 and 103 are lifted off and thus removed. Accordingly, the passivation layers 61 and 63 no longer cover the top surfaces of the source electrode 52 and the drain electrode 54. Thus, the top surfaces of the source electrode 52 and the drain electrode 54 are exposed. In one embodiment, a top surface cleaning process may be used to assuredly remove left behind micro remnants of the photoresist material of patterns 102 and 103. In other words, the effect that can be achieved when the passivation layer regions 61 and 63 are formed, that the tops of the source electrode 52 and the drain electrode 54 are not covered by the passivation layer material (61, 63). Since no additional photoresist process is now needed for selectively exposing the top surfaces of the source electrode 52 and the drain electrode 54, the entire fabrication process can be simplified.

Figure 11:
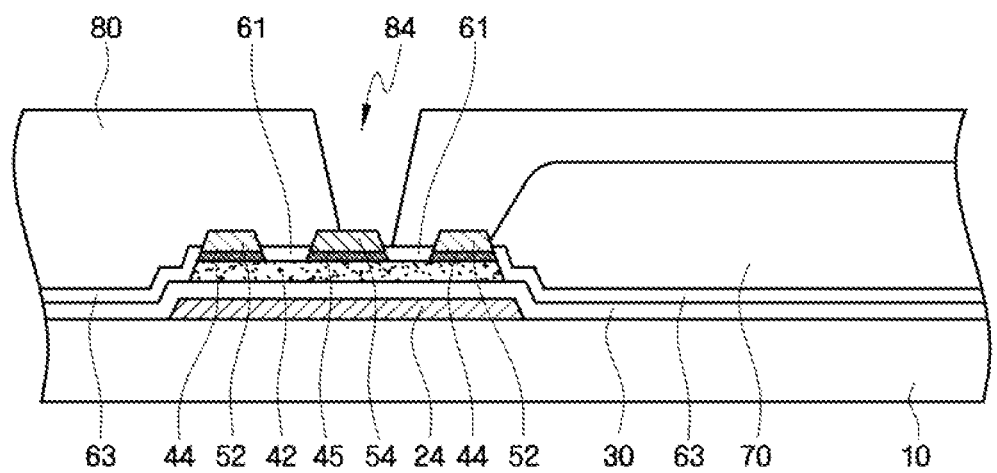

Referring to FIG. 11, a data insulating film 80 is formed on the source electrode 52, the drain electrode 54, the color filters 70, and the passivation layer 61. The data insulating film 80 may be made of an organic material to have superior planarization characteristics. Alternatively or additionally, the data insulating film 80 may be made of SiNx. Planarization of film 80 by CMP or the like may be carried out before and/or after the drain contact hole 84 is formed. After the data insulating film 80 is deposited, the drain contact hole 84 is formed in the data insulating film 80 to expose at least part of the drain electrode 54. Here, an overlay miss may occur between the bottom of the contact hole 84 (optionally down tapered hole 84) and the drain electrode 54, thereby causing the bottom of the contact hole 84 to expose part of the passivation layer 61 between the source and drain electrodes. That is, part of the contact hole 84 may overlap the top of the passivation layer 61 that covers the channel region CH_1.

According to the present disclosure, even when an overlay miss occurs, it is not accompanied by significant problems, as described above because the target missing portion of the downward extending pixel-electrode is vertically spaced apart from the semiconductor surface by the thickness of the passivation layer 61.

Referring back to FIG. 2, a transparent conductive material, such as ITO or IZO, is stacked on the data insulating film 80 by sputtering and then patterned to form a pixel electrode 90 which is electrically connected to the drain electrode 54 by passage through the contact hole 84.

Figure 12:
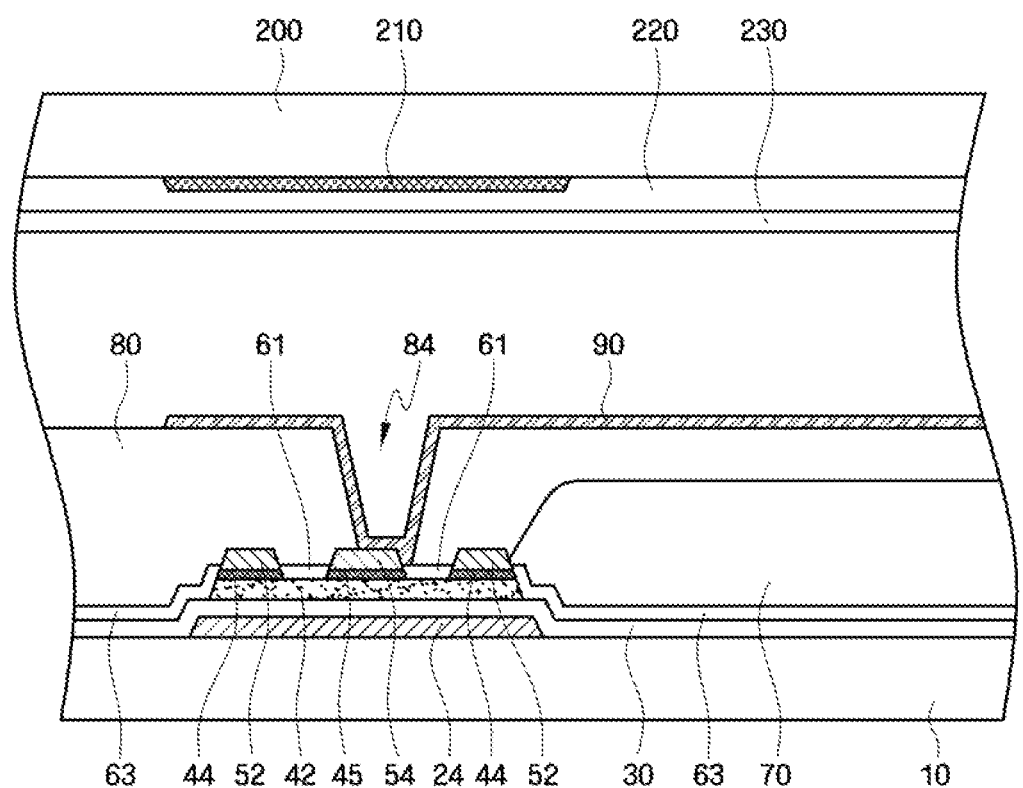
FIG. 12 is a cross-sectional view showing the relationship between the TFT substrate according to the first exemplary embodiment and an upper substrate that faces the TFT substrate.

FIG. 12 is a cross-sectional view showing the relationship between the TFT substrate according to the first exemplary embodiment and the upper substrate that faces the TFT substrate. Referring to FIG. 12, the upper substrate includes a base substrate 200, a black matrix 210, an overcoat layer 220, and a common electrode 230.

The black matrix 210 may be made of metal (metal oxide), such as chromium and chromium oxide, or organic black resist. The black matrix 210 may overlap a thin-film transistor formed on the TFT substrate. Accordingly, the black matrix 210 can prevent leakage of light, thereby improving image quality. According to the present disclosure, the contact hole 84 is formed in a region overlapped by the black matrix 210. The size of the black matrix 210 does not need to be increased when the thickness of the planarization layer 80 is increased because the present design can tolerate misalignment between the drain contact hole 84 and the drain electrode 54. Thus, an aperture ratio of the device need not be decreased when planarization thickness is increased, where decrease of the aperture ratio disadvantageously reduces image quality and/or increases backlighting power consumption.

Figure 13:
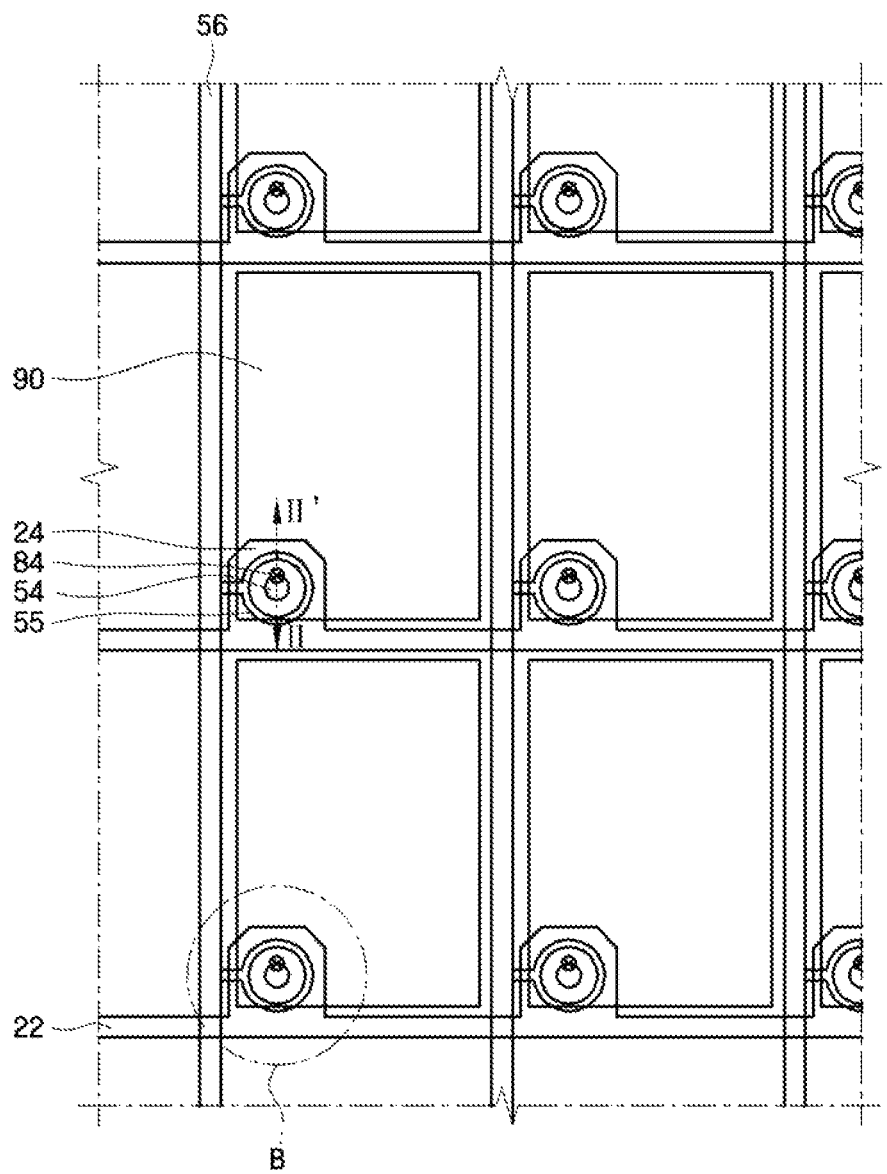
FIG. 13 is a plan view of a TFT substrate according to a modified example of the first exemplary embodiment.
Figure 14A:
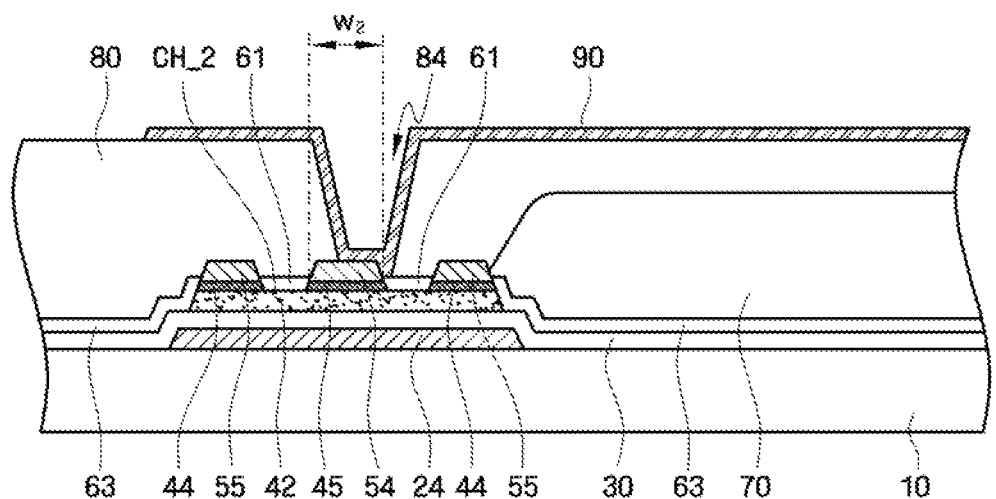
FIG. 14A is a cross-sectional view of the TFT substrate taken along the line II-IF of FIG. 13.
Figure 14B:
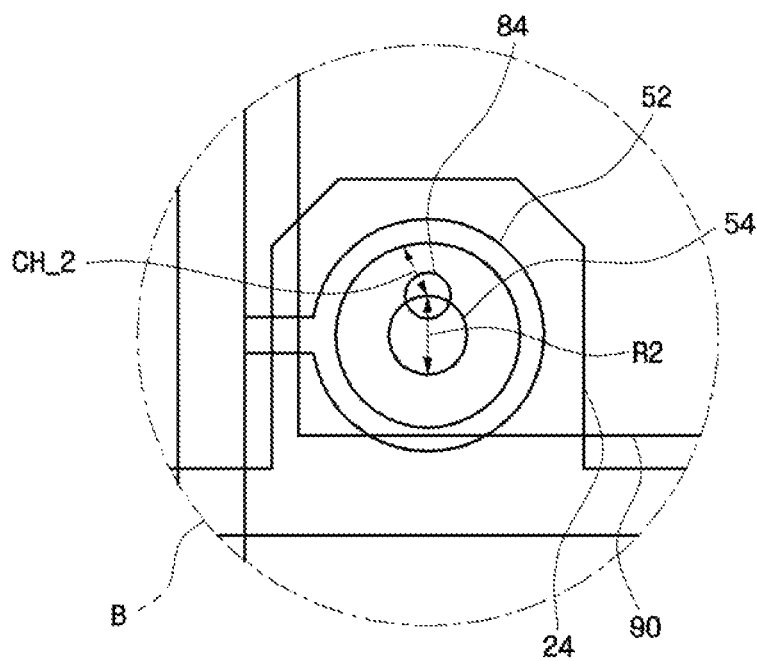
FIG. 14B is an enlarged view of a portion 'B' in FIG. 13.

Hereinafter, a TFT substrate according to a modified example of the first exemplary embodiment will be described with reference to FIGS. 13 through 14B. FIG. 13 is a plan view of the TFT substrate according to the modified example of the first exemplary embodiment of the present invention. FIG. 14A is a cross-sectional view of the TFT substrate taken along the line II-II' of FIG. 13. FIG. 14B is an enlarged view of a portion 'B' in FIG. 13. For simplicity, elements having the same functions as those shown in the drawings for the first exemplary embodiment are indicated by like reference numerals, and thus their description will be omitted or simplified.

Referring to FIG. 13, a source electrode 55 according to the modified example of the first exemplary embodiment fully surrounds the drain electrode 54. Accordingly, a thin-film transistor according to the modified example of the first exemplary embodiment has a greater effective channel width than a thin-film transistor according to the first exemplary embodiment and thus can exhibit lower source to drain resistance when turned on and can provide better operation performance.

A method of fabricating a TFT substrate according to a modified example of the second exemplary embodiment is substantially identical to the method of fabricating a TFT substrate according to the second exemplary embodiment except that a source electrode 55 is formed to fully surround the drain electrode 54, and thus a detailed description thereof will not be repeated.

Figure 15:
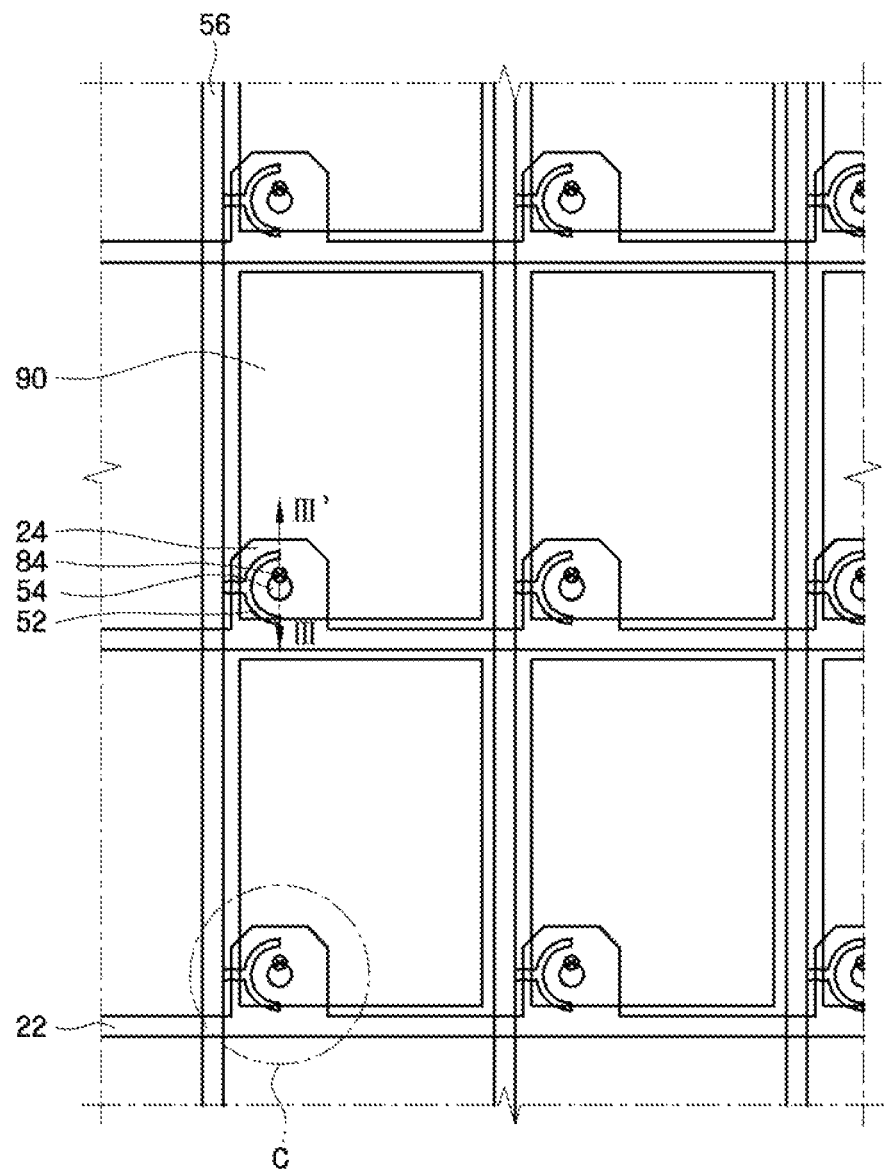
FIG. 15 is a plan view of a TFT substrate according to a third exemplary embodiment.
Figure 16A:
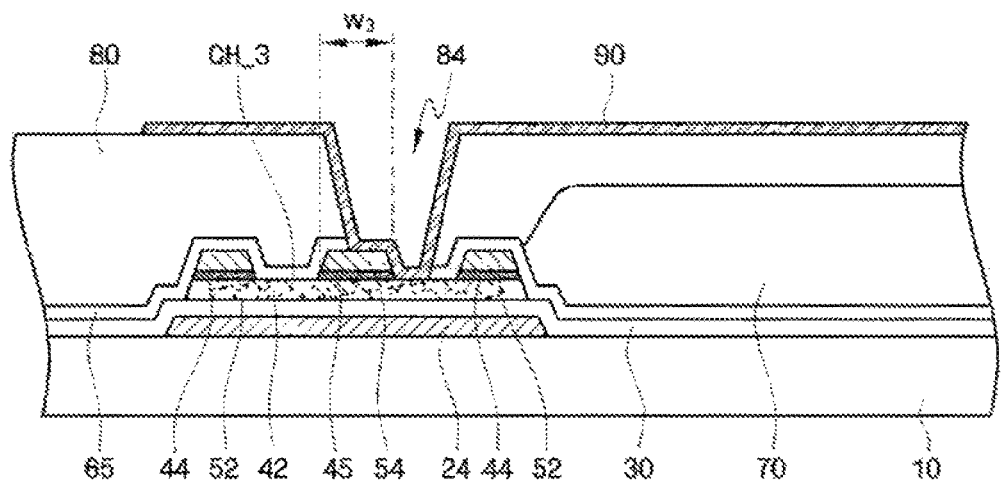
FIG. 16A is a cross-sectional view of the TFT substrate taken along the line III-III' of FIG. 15.
Figure 16B:
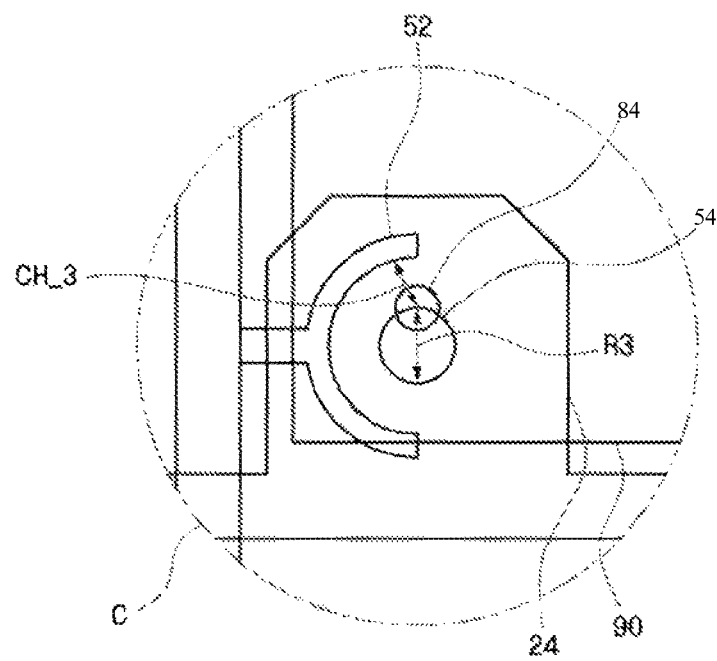
FIG. 16B is an enlarged view of a portion 'C' in FIG. 15.

Hereinafter, a TFT substrate according to a third exemplary embodiment of the present invention will be described in detail with reference to FIGS. 15 through 16B. FIG. 15 is a plan view of the TFT substrate according to the third exemplary embodiment of the present invention. FIG. 16A is a cross-sectional view of the TFT substrate taken along the line III-III' of FIG. 15. FIG. 16B is an enlarged view of a portion 'C' in FIG. 15. For simplicity, elements having the same functions as those shown in the drawings for the first exemplary embodiment are indicated by like reference numerals, and thus their description will be omitted or simplified. The TFT substrate according to the third exemplary embodiment is identical to the TFT substrate according to the first exemplary embodiment except for the following features.

In the TFT substrate according to the third exemplary embodiment, a passivation layer 65 covers a source electrode 52 and a drain electrode 54. In addition, a contact hole 84 is formed in the passivation layer 65 and a data insulating film 80. Here, the contact hole 84 overlaps a channel region CH_3. Accordingly, the channel region CH_3 of a semiconductor layer 42 is exposed. Thus, part of a pixel electrode 90 may extend to directly contact the semiconductor layer 42. At the same time the pixel electrode 90 of this embodiment contacts the full sidewall of drain electrode 54.

Figure 17:
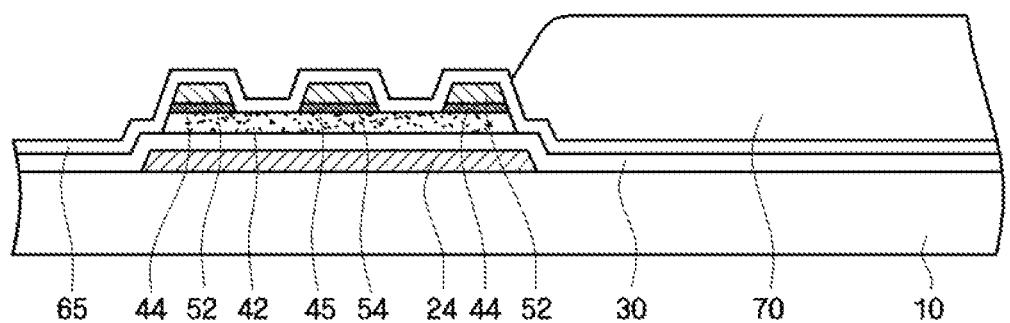
FIGS. 17 and 18 are cross-sectional views for explaining a method of fabricating a TFT substrate according to a fourth exemplary embodiment.
Figure 18:
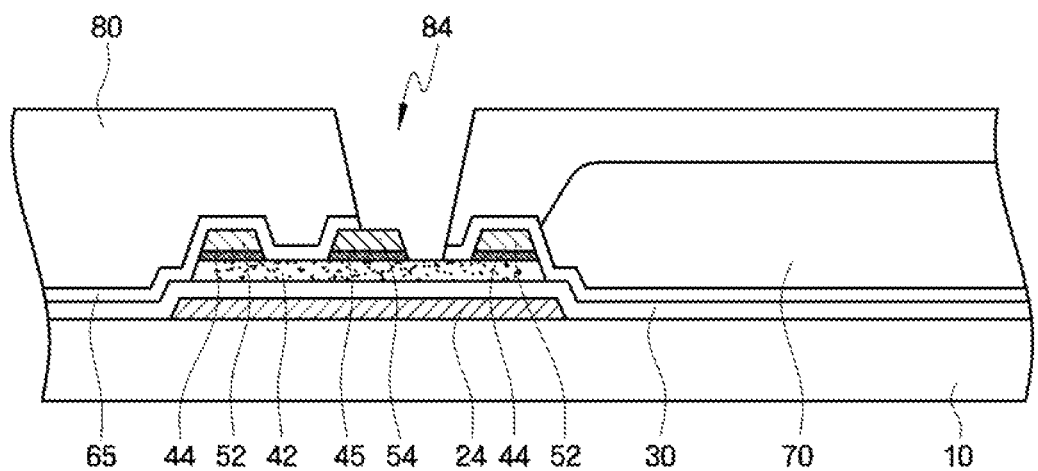

Hereinafter, a method of fabricating a TFT substrate according to a fourth exemplary embodiment will be described with reference to FIGS. 17 through 19. FIGS. 17 and 18 are cross-sectional views for explaining the method of fabricating a TFT substrate according to the fourth exemplary embodiment of the present invention. For simplicity, elements having the same functions as those shown in the drawings for the first exemplary embodiment are indicated by like reference numerals, and thus their description will be omitted or simplified. The method of fabricating a TFT substrate according to the fourth exemplary embodiment is identical to the method of fabricating a TFT substrate according to the second exemplary embodiment except for the following features.

Referring to FIG. 17, a source electrode 52 and a drain electrode 54 are formed on a substrate, and an insulating material is stacked on the substrate by PECVD or CVD, thereby forming a passivation film 60. Here, the insulating material may be SiO2 or SiNx.

Next, a data insulating film 80 is formed on the resultant structure of FIG. 17. After the data insulating film 80 is formed, the data insulating film 80 and the passivation film 60 are patterned to form a contact hole 84. Here, part of the contact hole 84 may overlap a channel region CH_3 of a semiconductor layer 42. Unlike in the second exemplary embodiment, in the fourth exemplary embodiment, the passivation film 60' is patterned so that the later formed contact hole 84 extends through the passivation film 60' to expose part of the semiconductor layer 42. In other words, the passivation film 60' is intentionally patterned so that part of the semiconductor layer 42 is exposed. The passivation film 60' having the contact hole 84' formed therethrough will be referred to as a passivation layer 65.

When the contact hole 84' is formed, the passivation film 60 on the semiconductor layer 42 is etched. Thus, when the passivation film 60 is etched to form the contact hole 84, it may have a different etch selectivity from the semiconductor layer 42 in order to prevent the semiconductor layer 42 from being etched. In addition, when the data insulating film 80 is etched to form the contact hole 84, it may have a different etch selectivity from the semiconductor layer 42 in order to prevent the semiconductor layer 42 from being etched.

Figure 19:
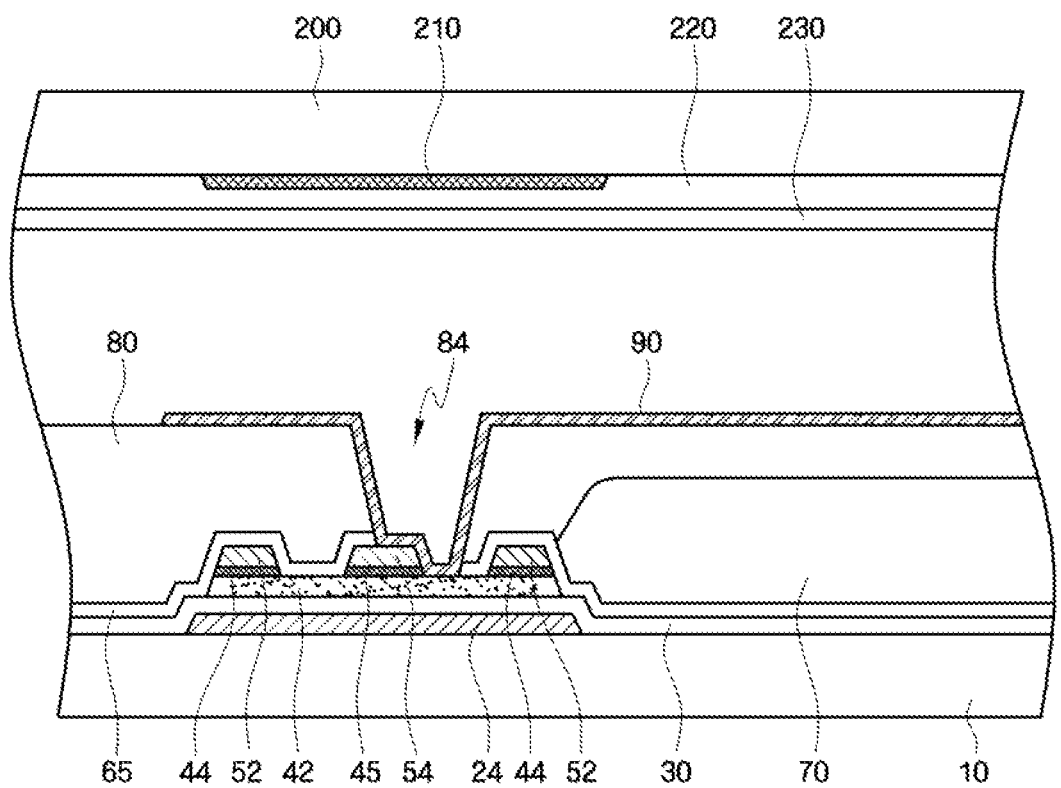
FIG. 19 is a cross-sectional view showing the relationship between the TFT substrate according to the third exemplary embodiment and an upper substrate that faces the TFT substrate.

FIG. 19 is a cross-sectional view showing the relationship between the TFT substrate according to the third exemplary embodiment and an upper substrate that faces the TFT substrate. Features shown in FIG. 19 are substantially identical to those shown in FIG. 12 except that the TFT substrate according to the third exemplary embodiment is applied, and thus a detailed description thereof will not be repeated.

Figure 20:
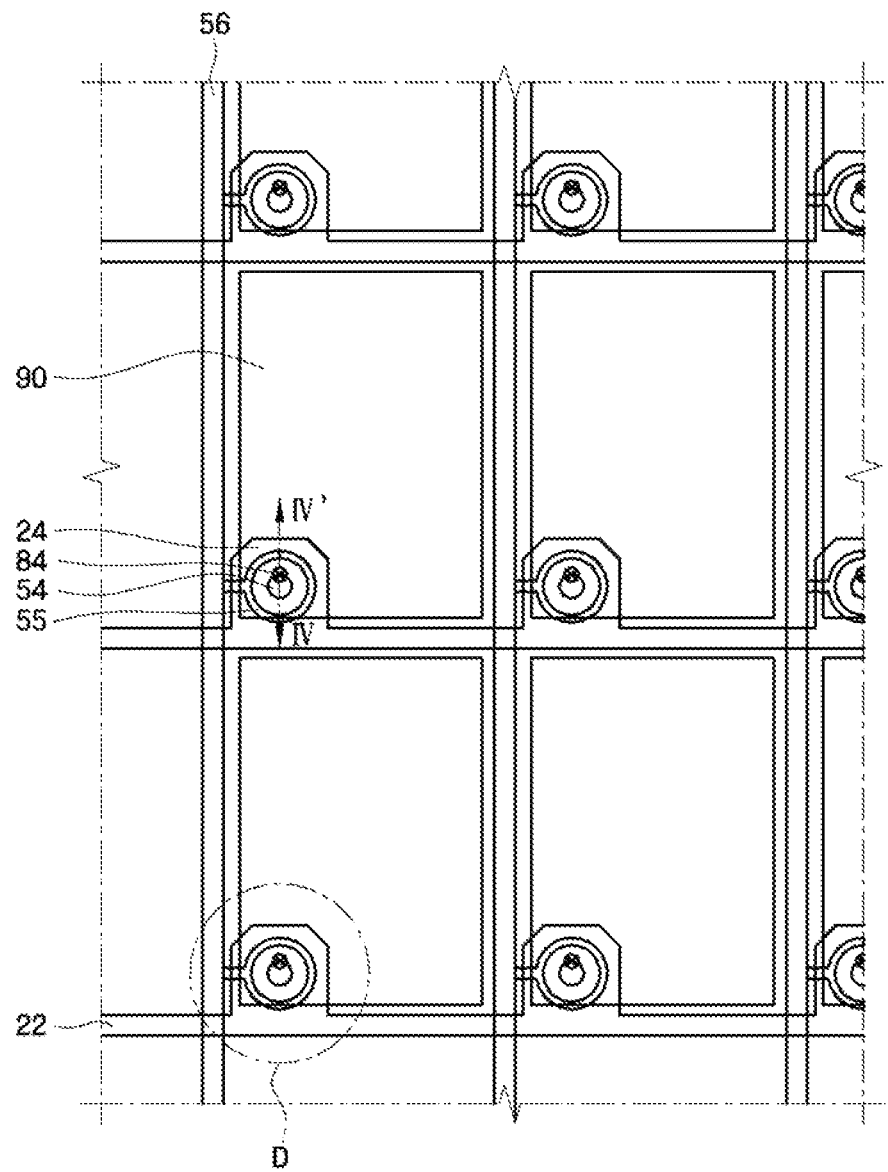
FIG. 20 is a plan view of a TFT substrate according to a modified example of the third exemplary embodiment.
Figure 21A:
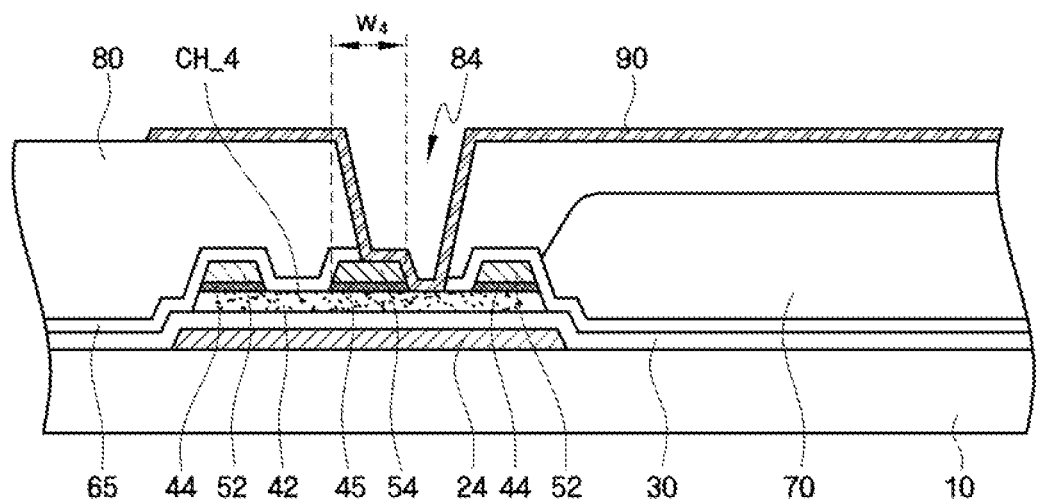
FIG. 21A is a cross-sectional view of the TFT substrate taken along the line IV-IV' of FIG. 20.
Figure 21B:
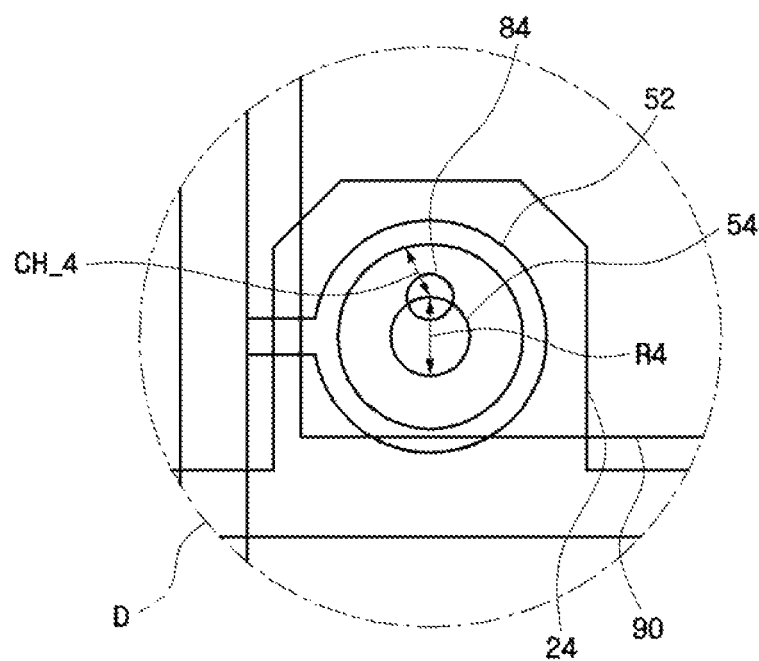
FIG. 21B is an enlarged view of a portion 'D' in FIG. 20.

Hereinafter, a TFT substrate according to a modified example of the third exemplary embodiment of the present invention will be described with reference to FIGS. 20 through 21B. FIG. 20 is a plan view of the TFT substrate according to the modified example of the third exemplary embodiment. FIG. 21A is a cross-sectional view of the TFT substrate taken along the line IV-IV' of FIG. 20. FIG. 21B is an enlarged view of a portion 'D' in FIG. 20. For simplicity, elements having the same functions as those shown in the drawings for the third exemplary embodiment are indicated by like reference numerals, and thus their description will be omitted or simplified.

Referring to FIG. 20, a source electrode 55 according to the modified example of the third exemplary embodiment fully surrounds the drain electrode 54. Accordingly, a thin-film transistor according to the modified example of the third exemplary embodiment has a greater channel width than a thin-film transistor according to the third exemplary embodiment and thus exhibits better operation performance.

A method of fabricating a TFT substrate according to a modified example of the fourth exemplary embodiment of the present invention is substantially identical to the method of fabricating a TFT substrate according to the fourth exemplary embodiment except that a source electrode 55 is formed to fully surround the drain electrode 54, and thus a detailed description thereof will not be repeated.

Figure 22:
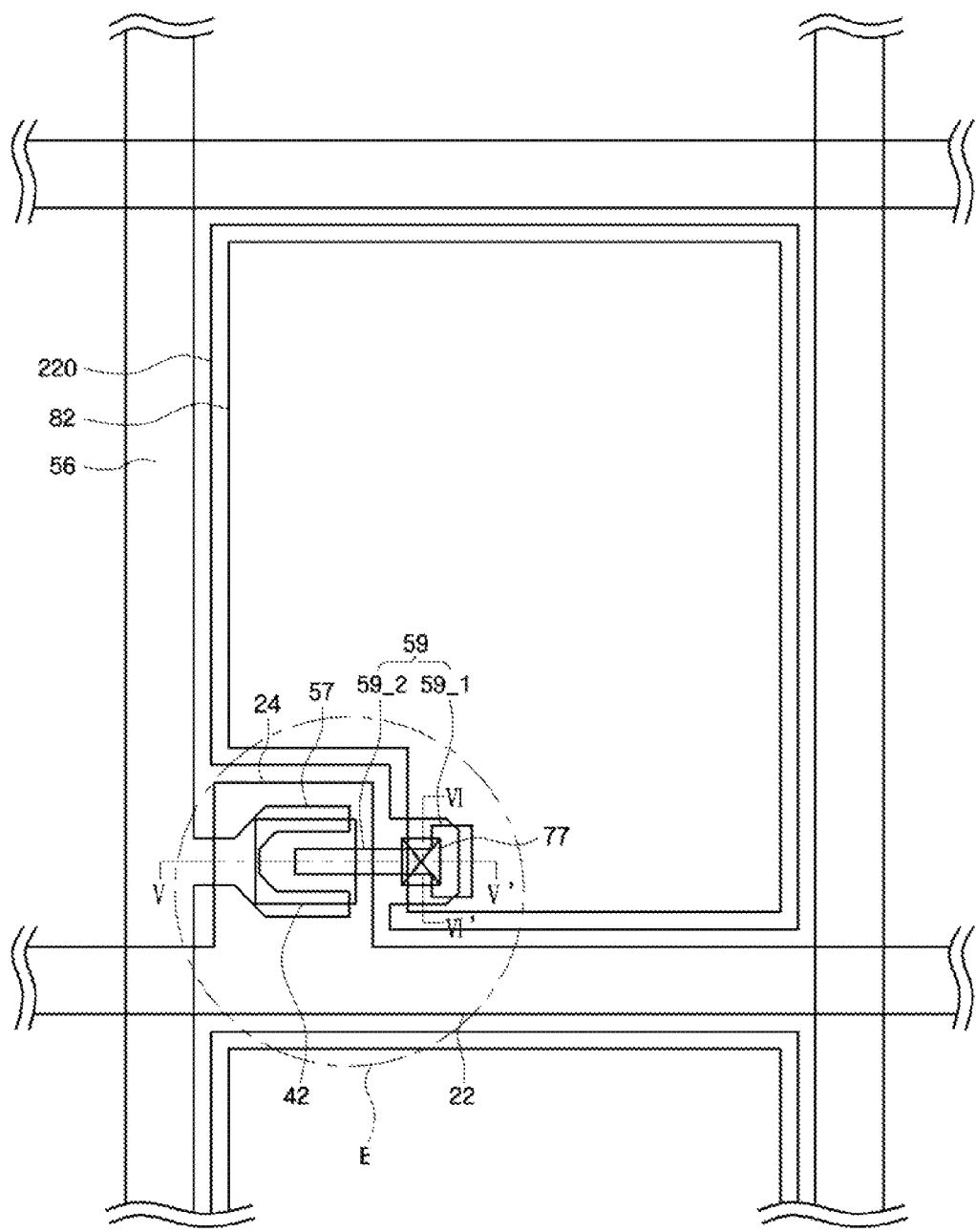
FIG. 22 is a layout diagram of a display device according to a fifth exemplary embodiment.
Figure 23:
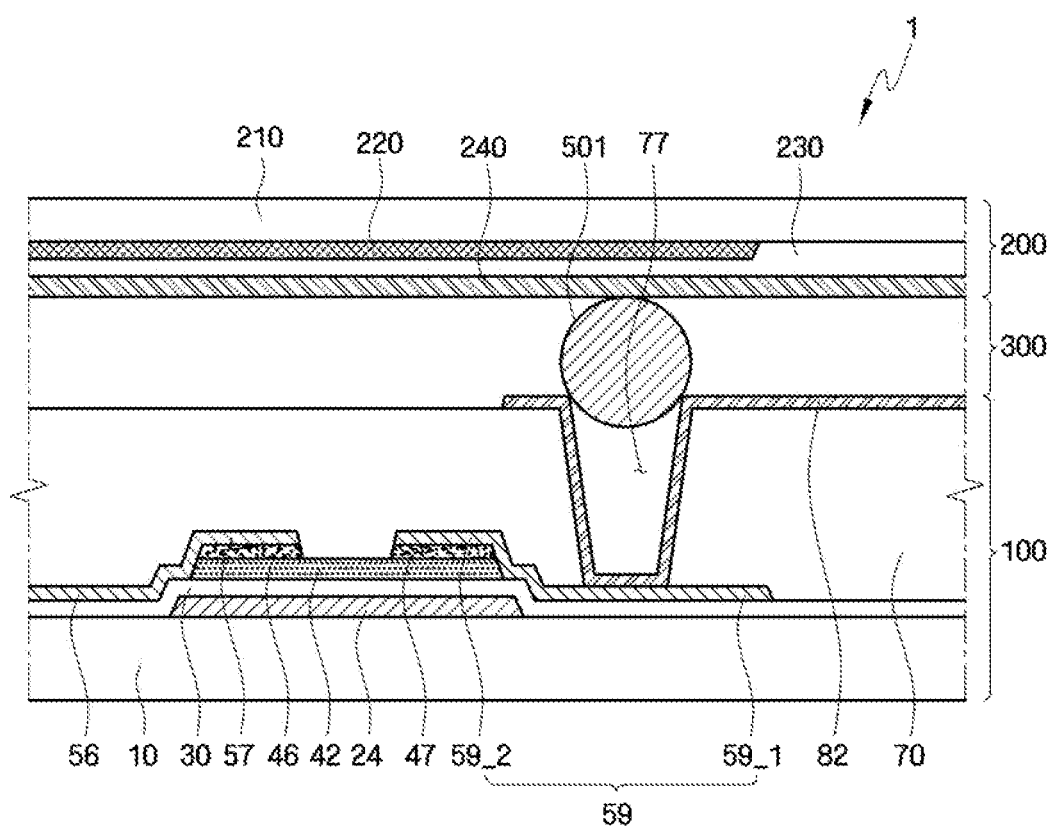
FIG. 23 is a cross-sectional view of the display device taken along the line V-V' of FIG. 22.
Figure 24:
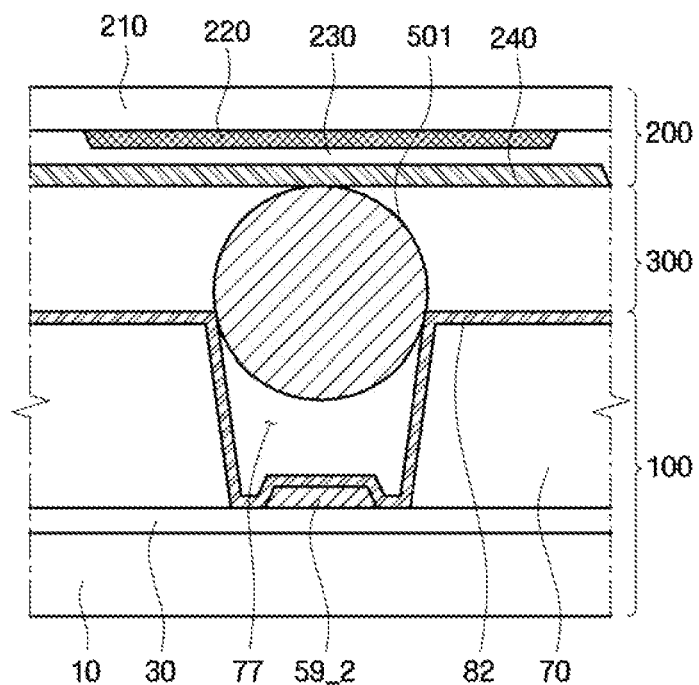
FIG. 24 is a cross-sectional view of the display device taken along the line VI-VI' of FIG. 22.
Figure 25A:
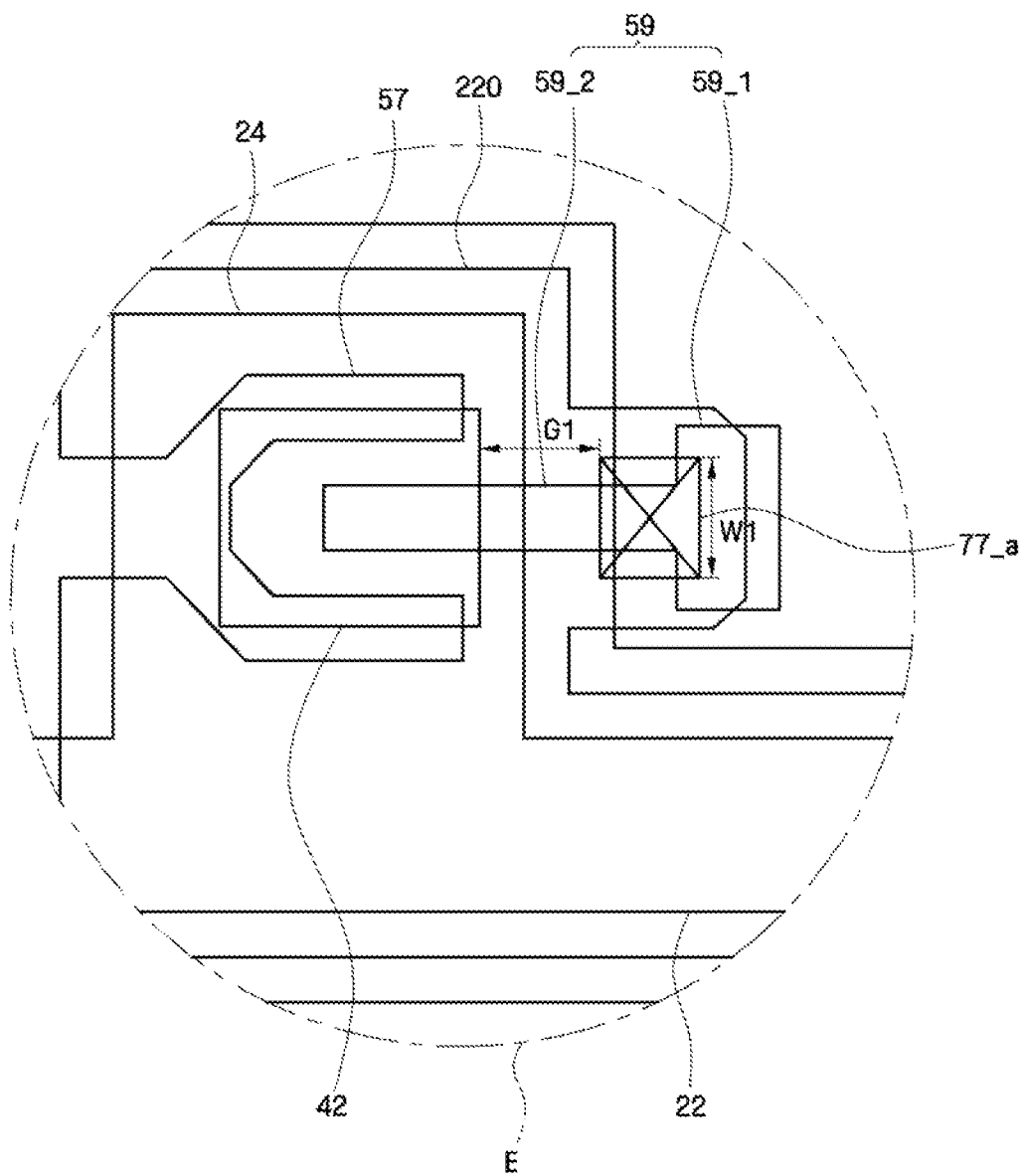
FIGS. 25A and 25B are enlarged views of a portion 'E' in FIG. 22.
Figure 25B:
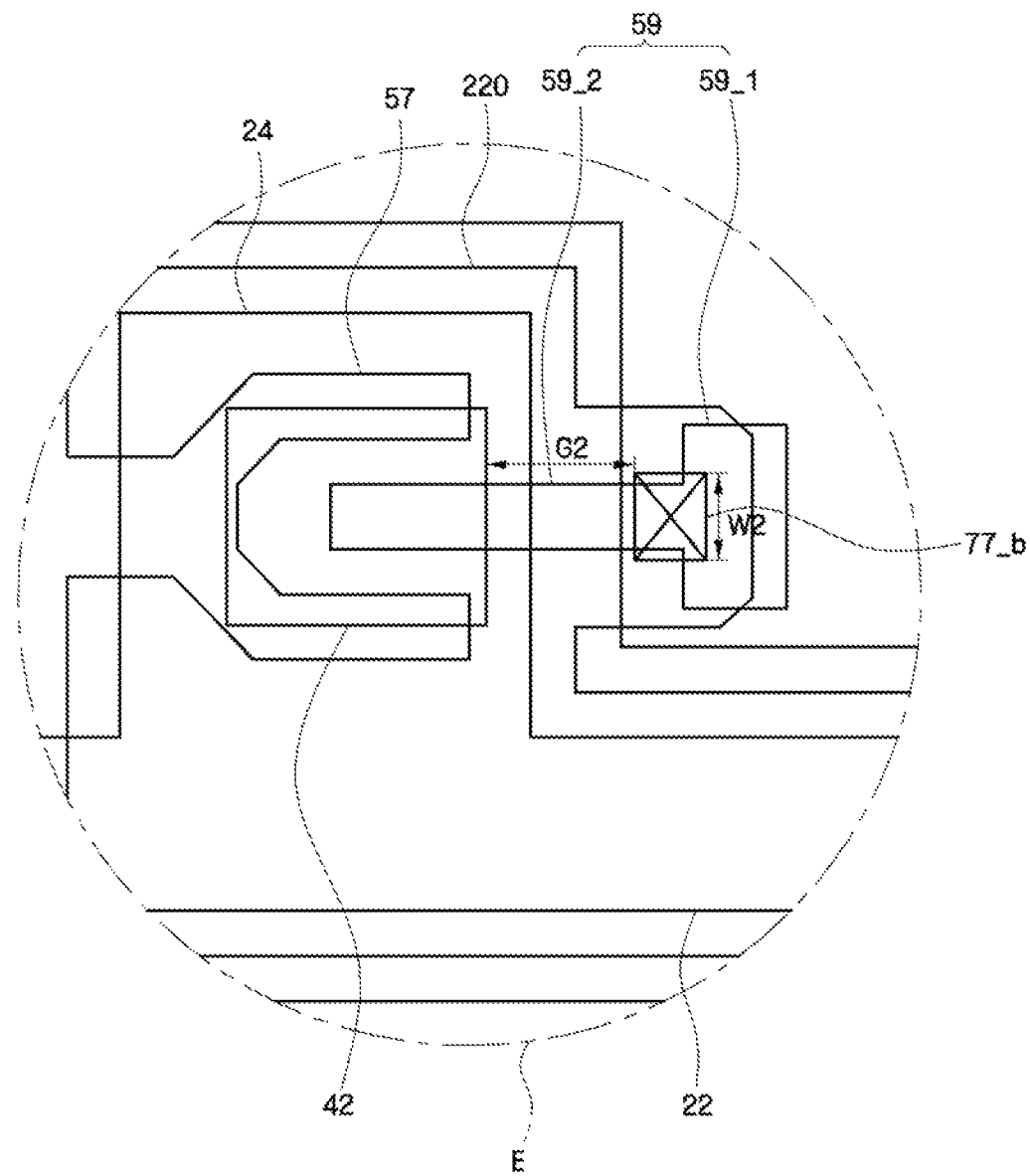

Hereinafter, a display device 1 according to a fifth exemplary embodiment will be described in detail with reference to FIGS. 22 through 25B. FIG. 22 is a layout diagram of the display device 1 according to the fifth exemplary embodiment. FIG. 23 is a cross-sectional view of the display device 1 taken along the line V-V' of FIG. 22. FIG. 24 is a cross-sectional view of the display device 1 taken along the line VI-VI' of FIG. 22. FIGS. 25A and 25B are enlarged views of a portion 'E' in FIG. 22.

Referring to FIGS. 22 through 24, the display device 1 according to the fifth exemplary embodiment includes a first display substrate 100, a second display substrate 200, a liquid crystal layer 300, and a colored column spacer 501.

The first display substrate 100 includes an insulating substrate 10, gate wiring, a gate insulating film 30, a semiconductor pattern 42, ohmic contact patterns 46 and 47, data wiring, a passivation film 70, a contact hole 77, and a pixel electrode 82.

The insulating substrate 10 may be made of a light-transmissive and heat-resistant material such as transparent glass or plastic.

The gate wiring is formed on the insulating substrate 10 in a first direction, for example, a horizontal direction. The gate wiring includes a plurality of gate lines 22 which deliver gate signals, a gate electrode 26 which integrally protrudes from each of the gate lines 22, and a gate line end terminal (not shown) which is formed at an end of each of the gate lines 22 and receives a gate signal from another layer or an external source to transmit the gate signal to each of the gate lines 22. The gate electrode 24, a source electrode 65 and a drain electrode 66, which will be described later, form three terminals of a thin-film transistor.

The gate wiring (i.e., the gate lines 22 and the gate electrode 24) may be made of an aluminum (Al)-based metal, such as aluminum and an aluminum alloy (e.g., A1, AlNd, AlCu, etc.), silver (Ag)-based metal, such as silver and a silver alloy, copper (Cu)-based metal such as copper and a copper alloy, molybdenum (Mo)-based metal such as molybdenum and a molybdenum alloy (e.g., Mo, MoN, MoNb, etc.), chromium (Cr), titanium (Ti) or tantalum (Ta).

In addition, the gate wiring may have a multi-film structure composed of two conductive films (not shown) with different physical characteristics. One of the two conductive films may be made of metal with low resistivity, such as aluminum-based metal, silver-based metal or copper-based metal, in order to reduce a signal delay or a voltage drop of the gate wiring. The other one of the conductive films may be made of a different material, in particular, a material having superior contact characteristics with ITO and IZO, such as molybdenum-based metal, chromium, titanium, or tantalum. Examples of multi-film structures include a chromium lower film and an aluminum upper film or an aluminum lower film and a molybdenum upper film. However, the present teachings are not limited thereto. The gate wiring may be made of various other metals and conductors.

The gate insulating film 30 is formed on the gate wiring and portions of the insulating substrate 10 which are exposed by the gate wiring. The gate insulating film 30 may be made of an inorganic insulating material such as SiOx and SiNx, or may be made of an organic insulating material such as benzocyclobutene (BCB), an acrylic material, and polyimide. The gate insulating film 30 covers the gate wiring (i.e., the gate lines 22 and the gate electrode 24). In particular, the gate insulating film 30 is formed on the entire surface of the insulating substrate 10, including a pixel region in which the pixel electrode 82 is formed. Here, a pixel region may be understood as a region which is defined by the gate wiring and the data wiring and through which light emitted from a backlight assembly (not shown) of the display device 1 passes.

The semiconductor pattern 42, which is made of hydrogenated amorphous silicon, polycrystalline silicon or a conductive organic material, is formed on a portion of the gate insulating film 30.

The semiconductor pattern 42 may have various shapes. For example, the semiconductor pattern 42 may be an island or may be formed linearly. If the semiconductor pattern 42 is shaped like an island as in the current exemplary embodiment, it may be overlapped by part of a source electrode 57 and part of a drain electrode 59 above the gate electrode 24. The shape of the semiconductor pattern 42 may not be limited to an island.

The ohmic contact patterns 46 and 47 may be formed on the semiconductor pattern 42. The ohmic contact patterns 46 and 47 are made of silicide, n+ hydrogenated amorphous silicon which is doped with n-type impurities in high concentration, or a material doped with p-type impurities, such as ITO. The ohmic contact patterns 46 and 47 are formed in pairs on the semiconductor pattern 42 and improve contact characteristics between the source electrode 57 and the semiconductor pattern 42 and between the drain electrode 59 and the semiconductor pattern 42. When the contact characteristics between the source electrode 57 and the semiconductor pattern 42 and between the drain electrode 59 and the semiconductor pattern 42 are good enough, the ohmic contact patterns 46 and 47 may be omitted.

On the resultant structure including the ohmic contact patterns 55 and 56, the data wiring, which includes a data line 56, the source electrode 57, the drain electrode 59 and a data line end terminal (not shown), is formed.

The data line 56 extends in a second direction, for example, a vertical direction. In addition, the data line 56 is insulated from each of the gate lines 22 and crosses each of the gate line 22.

The source electrode 57 integrally protrudes from the data line 56 in the form of a branch and extends onto the semiconductor pattern 42. The data line end terminal (not shown) is formed at an end of the data line 56. The data line end terminal receives a data signal from another layer or an external source and delivers the received data signal to the data line 56.

The source electrode 57 at least partially overlaps the semiconductor pattern 42. The drain electrode 59 is separated from the source electrode 57 and is disposed above the semiconductor pattern 42 to face the source electrode 57 with respect to the gate electrode 24. The semiconductor pattern 42 is exposed in the gap between the source electrode 57 and the drain electrode 59. A thin-film transistor is a three-terminal device composed of the gate electrode 24, the source electrode 57, and the drain electrode 59. In addition, a thin-film transistor is a switching device that allows electric current to flow between the source electrode 57 and the drain electrode 59 when a voltage is applied to the gate electrode 24.

The drain electrode 59 may include a first drain electrode portion 59_1 and a second drain electrode portion 59_2 which extends from the first drain electrode portion 59_1 toward the source electrode 57. The first drain electrode portion 59_1 may be formed as a pattern relatively wider than the second drain electrode portion 59_2. The second drain electrode portion 59_2 may be formed as a bar-shaped pattern that extends from the first drain electrode portion 59_1 toward the source electrode 57.

The data wiring (i.e., the data line 56, the source electrode 57, and the drain electrode 59) may be a single film or multiple films which is/are made of one or more of Al, an Al alloy (e.g., Al, AlNd, AlCu or the like), Cr, a Cr alloy, Mo, a Mo alloy (e.g., Mo, MoN, MoNb or the like), Ta, a Ta alloy, Ti and a Ti alloy. For example, the data wiring may be made of refractory metal such as Cr, Mo-based metal, Ta and Ti. In addition, the data wiring may be formed of refractory metal such as chromium, molybdenum-based metal, tantalum, and titanium. In addition, the data wiring may have a multi-film structure composed of a lower film (not shown), which is formed of refractory metal, and an upper film (not shown) which is formed of a material with low resistivity and is disposed on the lower film. Examples of multi-film structures include a chromium lower film and an aluminum upper film and an aluminum lower film and a molybdenum upper film. Alternatively, the multi-film structure may be a three-film structure having molybdenum-aluminum-molybdenum films.

The passivation film 70 is formed on the data wiring (i.e., the data line 56, the source electrode 57, and the drain electrode 59) and exposed portions of the gate insulating film 30. The passivation film 70 may be made of an inorganic material such as silicon nitride or silicon oxide, an organic material having photosensitivity and superior planarization characteristics, or a low-k dielectric material formed by PECVD, such as a-Si:C:O or a-Si:O:F.

The contact hole 77, which exposes the drain electrode 59, is formed in the passivation film 70. The contact hole 77 exposes part of the first drain electrode portion 59_1 and part of the second drain electrode portion 59_2. In addition, the contact hole 77 exposes a portion of the gate insulating film 30 which is located in a region adjacent to where the first drain electrode portion 59_1 meets the second drain electrode portion 59_2. That is, since the first drain electrode portion 59_1 is relatively wider than the second drain electrode portion 59_2, a portion of the gate insulating film 30 in a peripheral region of the second drain electrode portion 59_2 may be exposed by the contact hole 77.

The pixel electrode 82 is formed on the passivation film 70 which is located in a pixel region and is connected to the drain electrode 59 by the contact hole 77. The contact hole 77 exposes a portion of the first drain electrode portion 59_1 and a portion of the second drain electrode portion 59_2 such that the pixel electrode 82 contacts a portion of the first drain electrode portion 59_1 and a portion of the second drain electrode portion 59_2. In addition, the pixel electrode 82 may be formed in a region of the gate insulating film which is exposed by the contact hole 77.

The pixel electrode 82 may be made of a transparent conductor, such as ITO or IZO, or a reflective conductor such as aluminum.

Although not shown in the drawings, each color filter (not shown) may be formed in a pixel region before the passivation film 70 is formed in the pixel region. Each color filter absorbs or passes light of a predetermined wavelength by using a red, green or blue pigment included therein in order to represent red, green or blue color. The color filters may represent various colors by additively mixing red, green and blue light that passed therethrough.

The second display substrate 200 will now be described below. A black matrix 220 for preventing leakage of light is formed on an insulating substrate 210. The black matrix 220 is formed in regions other than a region facing the pixel electrode 82, thereby defining a pixel region.

The black matrix 220 may overlap the drain electrode 59 disposed on the first display substrate 100. That is, the black matrix 220 may overlap the first drain electrode portion 59_1 and the second drain electrode portion 592 of the drain electrode 59. In order to minimize a reduction in the aperture ratio due to the black matrix 220, the black matrix 220 may overlap part of the first drain electrode portion 59_1. That is, a side of the first drain electrode portion 59_1 which does not meet the second drain electrode portion 59_2 may not be overlapped by the black matrix 220.

The black matrix 220 may overlap the contact hole 77 of the first display substrate 100. That is, the contact hole 77 may be disposed in a region in which the black matrix 220 of the second display substrate 200 is formed. Thus, since the contact hole 77 is not disposed in a pixel region, the aperture ratio of the display device 1 can be increased. A width of the contact hole 77 may increase as the distance between the contact hole 77 and the semiconductor pattern 42 is reduced and may decrease as the distance between the contact hole 77 and the semiconductor pattern 42 increases.

Specifically, referring to FIG. 25A, when a contact hole 77_a is separated from the semiconductor pattern 42 by a first gap G1, it may have a first aperture width W1. Referring to FIG. 25B, when a contact hole 77_b is separated from the semiconductor pattern 42 by a second gap G2, it may have a second aperture width W2. Here, if the second gap G2 is wider than the first gap G1, the second aperture width W2 should be narrower than the first aperture width W1. If the second aperture width W2 is substantially equal to or wider than the first aperture width W1, a portion of the contact hole 77_b may be outside the region in which the black matrix 220 is formed. Accordingly, the overall aperture ratio of the display device 1 may be reduced. Therefore, if the second gap G2 is wider than the first gap G1, the second aperture width W2 should be narrower than the first aperture width W1. The black matrix 220 may be made of an opaque organic material or opaque metal.

Color filters (not shown) for representing colors may be formed on the insulating substrate 210. In this case, the color filters may not be formed on the first display substrate 100. That is, in the display device 1 according to the present invention, color filters may be formed on the first display substrate 100 or the second display substrate.

An overcoat layer 230 may be formed on the black matrix 220 in order to planarize step heights of the second display substrate 200. The overcoat layer 240 is made of a transparent organic material, protects the color filters and the black matrix 220, and insulates the black matrix 220 and the color filters from a common electrode 240 which will be described later.

The common electrode 240 is formed on the overcoat layer 230. The common electrode 240 may be made of a transparent conductive material, such as ITO or IZO.

The liquid crystal layer 300 is interposed between the first display substrate 100 and the second display substrate 200. The voltage difference between the pixel electrode 82 and the common electrode 240 determines transmittance.

A colored column spacer 501 is interposed between the first display substrate 100 and the second display substrate 200. The colored column spacer 501 according to the fifth exemplary embodiment maintains a cell gap between the first display substrate 100 and the second display substrate 200. The colored column spacer 501 may overlap the contact hole 77 of the first display substrate 100. Accordingly, external light can be prevented from entering a thin-film transistor through the contact hole 77. The colored column spacer 501 may be, e.g., black.

While teachings in accordance with the present disclosure of invention have been particularly shown and described with reference to exemplary embodiments thereof, it will be understood by those of ordinary skill in the art in light of the foregoing that various changes in form and detail may be made therein without departing from the spirit and scope of the present teachings. The exemplary embodiments should be considered in a descriptive sense only and not for purposes of limitation.

What is claimed is:

1. A method of fabricating a thin-film transistor (TFT) substrate, the method comprising:
   forming a gate electrode on a pixel region of a substrate;
   forming a gate insulating film on the gate electrode;
   forming a semiconductor layer on the gate insulating film to overlap the gate electrode;
   forming a source electrode and a spaced apart drain electrode both to overlap the semiconductor layer and thus define a channel region in the semiconductor layer where not overlapped by the source and drain electrodes; and
   forming a data insulating film on the source electrode and the drain electrode; and
   patterning the data insulating film such that a bottommost part of a drain contact hole formed through the data insulating film by patterning overlaps part of the channel region and the drain electrode,
   wherein the bottommost part of the drain contact hole that overlaps the part of the channel region does not overlap the drain electrode; and
   and forming a conductor extending to the bottommost part of the drain contact hole and making electrical contact with a sidewall part of the drain electrode that is exposed by the drain contact hole.

2. The method of claim 1, wherein a linewidth or diameter of the drain electrode is 6 μm or less.

3. The method of claim 2, wherein the source electrode surrounds the drain electrode.

4. The method of claim 2, wherein the patterning of the data insulating film comprises etching the data insulating film without etching the semiconductor layer.

5. The method of claim 2, further comprising forming a passivation layer in a region between the source electrode and the drain electrode above the semiconductor layer, wherein the passivation layer does not cover a top surface of the source electrode and a top surface of the drain electrode.

6. The method of claim 5, wherein the passivation layer and the data insulating film are made of different materials.

7. The method of claim 5, wherein the drain contact hole exposes the passivation layer formed on the channel region.

8. The method of claim 6, wherein the passivation layer is silicon oxide (SiOx), and the data insulating film is silicon nitride (SiNx).

9. The method of claim 5, wherein the forming of the passivation layer comprises stacking an insulating material on photoresist patterns, which are formed respectively and directly on the source electrode and the drain electrode, and the semiconductor layer and simultaneously exfoliating the photoresist patterns and the insulating material.

* * * * *